(12) United States Patent
Takagi et al.

(10) Patent No.: US 8,076,167 B2
(45) Date of Patent: Dec. 13, 2011

(54) GROUP-III NITRIDE SEMICONDUCTOR LASER DEVICE, AND METHOD FOR FABRICATING GROUP-III NITRIDE SEMICONDUCTOR LASER DEVICE

(75) Inventors: Shimpei Takagi, Osaka (JP); Yusuke Yoshizumi, Itami (JP); Koji Katayama, Osaka (JP); Masaki Ueno, Itami (JP); Takatoshi Ikegami, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 12/836,253

(22) Filed: Jul. 14, 2010

(65) Prior Publication Data

US 2011/0128983 A1    Jun. 2, 2011

(30) Foreign Application Priority Data

Dec. 1, 2009    (JP) .............................. P2009-273897

(51) Int. Cl.
*H01L 21/00* (2006.01)

(52) U.S. Cl. ............... 438/33; 438/42; 257/E21.085; 257/E21.238; 257/E21.599

(58) Field of Classification Search ............... 438/33, 438/42; 257/E21.085, E21.238, E21.599
See application file for complete search history.

(56) References Cited

U.S. PATENT DOCUMENTS

| 6,596,079 | B1 * | 7/2003 | Vaudo et al. ............... 117/97 |
| 2003/0030053 | A1 | 2/2003 | Kawakami et al. |
| 2004/0191942 | A1 | 9/2004 | Kawakami et al. |

(Continued)

FOREIGN PATENT DOCUMENTS

| JP | 2003-017791 | 1/2003 |
| JP | 2008-060555 | 3/2008 |
| JP | 2008-543089 | 11/2008 |
| JP | 2009117494 A | 5/2009 |

(Continued)

OTHER PUBLICATIONS

Enya et al. "531 nm Green Lasing of InGaN Based Laser Diodes on Semi-Polar [20-21] Free-Standing GaN Substrates," Applied Physics Express, vol. 2, No. 8, 082101, pp. 082101-1-082101-3, (Jul. 17, 2009).

(Continued)

*Primary Examiner* — Alexander Ghyka
*Assistant Examiner* — Seahvosh Nikmanesh
(74) *Attorney, Agent, or Firm* — Venable LLP; Michael A. Sartori; Leigh D. Thelen

(57) ABSTRACT

Provided are a group-III nitride semiconductor laser device with a laser cavity to enable a low threshold current on a semipolar surface of a hexagonal group-III nitride, and a method for fabricating the group-III nitride semiconductor laser device on a stable basis. Notches, e.g., notch 113a and others, are formed at four respective corners of a first surface 13a located on the anode side of a group-III nitride semiconductor laser device 11. The notch 113a or the like is a part of a scribed groove provided for separation of the device 11. The scribed grooves are formed with a laser scriber and the shape of the scribed grooves is adjusted by controlling the laser scriber. For example, a ratio of the depth of the notch 113a or the like to the thickness of the group-III nitride semiconductor laser device 11 is not less than 0.05 and not more than 0.4, a tilt of a side wall surface at an end of the notch 113a is not less than 45° and not more than 85°, and a tilt of a side wall surface at an end of the notch 113b is not less than 10° and not more than 30°.

7 Claims, 26 Drawing Sheets

U.S. PATENT DOCUMENTS

2007/0093073 A1    4/2007    Farrell, Jr. et al.
2008/0056319 A1    3/2008    Ohno
2009/0262771 A1   10/2009    Inoue et al.

FOREIGN PATENT DOCUMENTS

JP           2008-060478        3/2008

OTHER PUBLICATIONS

Yoshizumi et al. "Continuous-Wave Operation of 530 nm Green InGaN-Based Laser Diodes on Semi-Polar {20-21} GaN Substrates," Applied Physics Express vol. 2, No. 9, 092101, pp. 092101-1-092101-3, (Aug. 21, 2009).

"Green Semiconductor Laser Moving Toward Practical Application—Sumitomo Electric Industries, Ltd.," Published in: Nikkan Kogyo Shinbun, (Aug. 20, 2009).

Tyagi et al., "Semipolar (1011) InGaN/GaN Laser Diodes on Bulk GaN Substrates," Japanese Journal of Applied Physics, vol. 46, No. 19, pp. L444-L445 (2007).

* cited by examiner

Fig.2
(a)
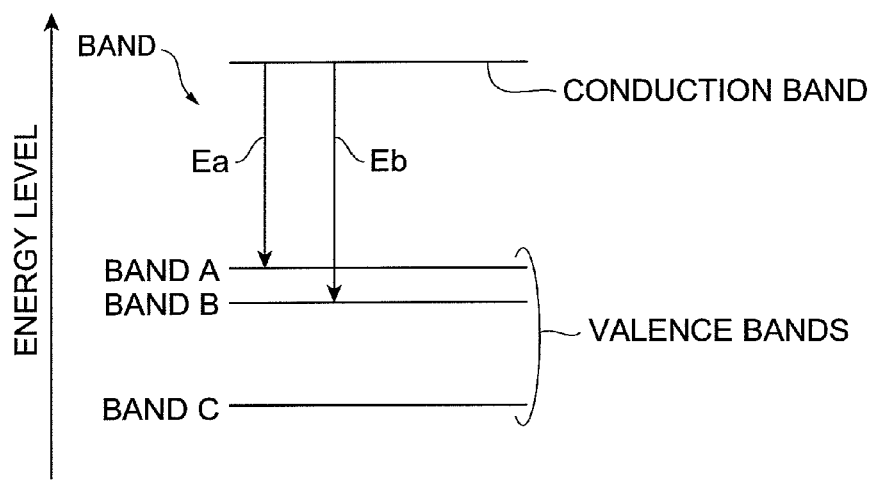
(b)
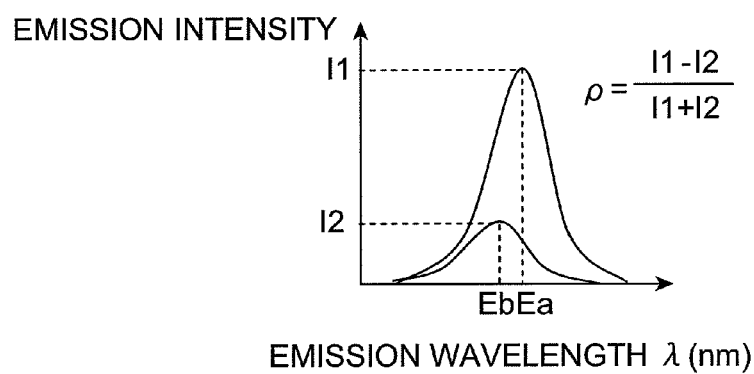

Fig.7
(a)
(b)
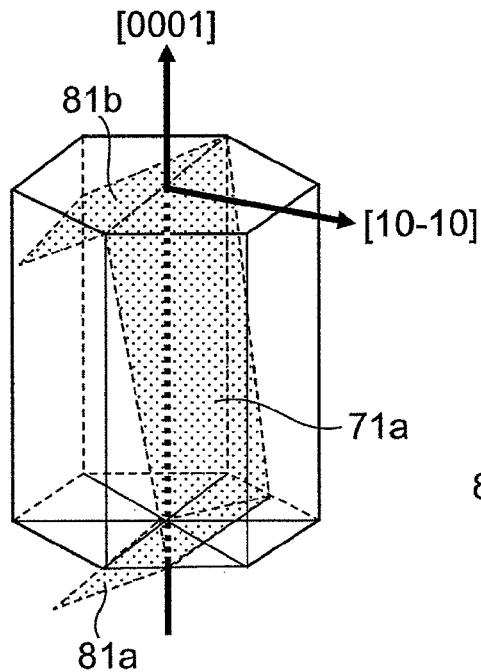
(c)
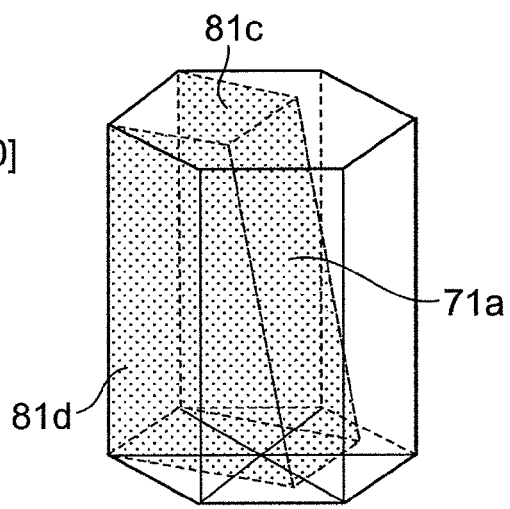

Fig.13

HEXAGONAL GaN

PLANE INDICES OF PLANES PERPENDICULAR TO (20-21)

| a | c | h1 | k1 | l1 | h2 | k2 | l2 | cos θ | Arccos(rad) | (deg) |
|---|---|---|---|---|---|---|---|---|---|---|
| 3.189 | 5.185 | -1 | 0 | 1 | 2 | 0 | 1 | -0.7 | 2.4 | 137.05 |
| 3.189 | 5.185 | -1 | 0 | 2 | 2 | 0 | 1 | -0.5 | 2.1 | 118.28 |
| 3.189 | 5.185 | -1 | 0 | 3 | 2 | 0 | 1 | -0.3 | 1.9 | 107.13 |
| 3.189 | 5.185 | -1 | 0 | 4 | 2 | 0 | 1 | -0.2 | 1.7 | 100.23 |
| 3.189 | 5.185 | -1 | 0 | 5 | 2 | 0 | 1 | -0.1 | 1.7 | 95.67 |
| 3.189 | 5.185 | -1 | 0 | 6 | 2 | 0 | 1 | 0.0 | 1.6 | 92.46 |
| 3.189 | 5.185 | -1 | 0 | 7 | 2 | 0 | 1 | 0.0 | 1.6 | 90.10 |
| 3.189 | 5.185 | -1 | 0 | 8 | 2 | 0 | 1 | 0.0 | 1.5 | 88.29 |
| 3.189 | 5.185 | -1 | 0 | 9 | 2 | 0 | 1 | 0.1 | 1.5 | 86.87 |
| 3.189 | 5.185 | -1 | 0 | 10 | 2 | 0 | 1 | 0.1 | 1.5 | 85.72 |
| 3.189 | 5.185 | -2 | 0 | 1 | 2 | 0 | 1 | -0.9 | 2.6 | 150.17 |
| 3.189 | 5.185 | -2 | 0 | 2 | 2 | 0 | 1 | -0.7 | 2.4 | 137.05 |
| 3.189 | 5.185 | -2 | 0 | 3 | 2 | 0 | 1 | -0.6 | 2.2 | 126.46 |
| 3.189 | 5.185 | -2 | 0 | 4 | 2 | 0 | 1 | -0.5 | 2.1 | 118.28 |
| 3.189 | 5.185 | -2 | 0 | 5 | 2 | 0 | 1 | -0.4 | 2.0 | 111.99 |
| 3.189 | 5.185 | -2 | 0 | 6 | 2 | 0 | 1 | -0.3 | 1.9 | 107.13 |
| 3.189 | 5.185 | -2 | 0 | 7 | 2 | 0 | 1 | -0.2 | 1.8 | 103.30 |
| 3.189 | 5.185 | -2 | 0 | 8 | 2 | 0 | 1 | -0.2 | 1.7 | 100.23 |
| 3.189 | 5.185 | -2 | 0 | 9 | 2 | 0 | 1 | -0.1 | 1.7 | 97.73 |
| 3.189 | 5.185 | -2 | 0 | 10 | 2 | 0 | 1 | -0.1 | 1.7 | 95.67 |
| 3.189 | 5.185 | -3 | 0 | 1 | 2 | 0 | 1 | -0.9 | 2.7 | 155.02 |
| 3.189 | 5.185 | -3 | 0 | 2 | 2 | 0 | 1 | -0.8 | 2.5 | 145.54 |
| 3.189 | 5.185 | -3 | 0 | 3 | 2 | 0 | 1 | -0.7 | 2.4 | 137.05 |
| 3.189 | 5.185 | -3 | 0 | 4 | 2 | 0 | 1 | -0.6 | 2.3 | 129.71 |
| 3.189 | 5.185 | -3 | 0 | 5 | 2 | 0 | 1 | -0.6 | 2.2 | 123.49 |
| 3.189 | 5.185 | -3 | 0 | 6 | 2 | 0 | 1 | -0.5 | 2.1 | 118.28 |
| 3.189 | 5.185 | -3 | 0 | 7 | 2 | 0 | 1 | -0.4 | 2.0 | 113.91 |
| 3.189 | 5.185 | -3 | 0 | 8 | 2 | 0 | 1 | -0.3 | 1.9 | 110.23 |
| 3.189 | 5.185 | -3 | 0 | 9 | 2 | 0 | 1 | -0.3 | 1.9 | 107.13 |
| 3.189 | 5.185 | -3 | 0 | 10 | 2 | 0 | 1 | -0.2 | 1.8 | 104.48 |

→ (-1016) PLANE
→ (-1017) PLANE
→ (-1018) PLANE

GROUP-III NITRIDE SEMICONDUCTOR LASER DEVICE, AND METHOD FOR FABRICATING GROUP-III NITRIDE SEMICONDUCTOR LASER DEVICE

BACKGROUND OF THE INVENTION

1. Field of the Invention

The present invention relates to a group-III nitride semiconductor laser device, and a method for fabricating the group-III nitride semiconductor laser device.

2. Related Background Art

Patent Literature 1 (Japanese Patent Application Laid-open No. 2009-117494) discloses a method for fabricating a semiconductor device, comprising a step of forming first auxiliary grooves in a semiconductor device structure provided on a semiconductor substrate; a step of forming second auxiliary grooves in the semiconductor device structure; and a step of dividing the semiconductor substrate and the semiconductor device structure in division directions along the first auxiliary grooves and the second auxiliary grooves. In this fabrication method, a plurality of second auxiliary grooves are separately provided in the division directions, and at least two first auxiliary grooves are provided separately from each other between at least a set of adjacent second auxiliary grooves out of the plurality of second auxiliary grooves. Then the foregoing dividing step involves dividing a separate region between the two first auxiliary grooves. Non Patent Literature 1 (Jpn. J. Appl. Phys. Vol. 46, (2007) L444) discloses a semiconductor laser device with a hexagonal GaN substrate of a low stacking fault density having a semipolar surface (10-11) and a laser structure provided on the semipolar surface. A waveguide extends in an off direction of the c-axis of the hexagonal GaN substrate, and mirrors of the semiconductor laser are formed by reactive ion etching (RIE).

SUMMARY OF THE INVENTION

The inventor considers that in the group-III nitride semiconductor laser device including the semipolar surface support base the c-axis of which tilts toward the m-axis, the threshold current can be lowered when the laser waveguide extends along a plane defined by the c-axis and the m-axis. However, when the laser waveguide extends in this orientation, there are no appropriate crystal facets suitable for the laser cavity mirrors, and it is thus difficult to form good laser cavity mirrors by the conventional technology making use of cleavage. The laser cavity mirrors are sometimes made by reactive ion etching (RIB), but the laser cavity mirrors made by RIE are required to improve in perpendicularity to the laser waveguide or in flatness of the dry etched faces. As far as the inventor knows, in a single group-III nitride semiconductor laser device formed on the semipolar surface, no one has succeeded heretofore in achieving both of the laser waveguide, which extends in the tilt direction (off direction) of the c-axis, and the end faces for laser cavity mirrors formed without use of dry etching. The present invention has been accomplished in view of the above-described circumstances. It is an object of the present invention to provide a group-III nitride semiconductor laser device with a laser cavity enabling a low threshold current, on a semipolar principal surface of a support base that tilts with respect to the c-axis toward the m-axis of a hexagonal group-III nitride. It is another object of the present invention of to provide a method for fabricating the group-III nitride semiconductor laser device on a stable basis.

A group-III nitride semiconductor laser device according to one aspect of the present invention comprises: a laser structure including a support base and a semiconductor region, the support base comprising a hexagonal group-III nitride semiconductor and having a semipolar principal surface, the semiconductor region being provided on the semipolar principal surface of the support base; and an electrode being provided on the semiconductor region of the laser structure, the semiconductor region including a first cladding layer of a first conductivity type gallium nitride-based semiconductor, a second cladding layer of a second conductivity type gallium nitride-based semiconductor, and an active layer, the active layer being provided between the first cladding layer and the second cladding layer, the first cladding layer, the second cladding layer, and the active layer being arranged along a normal axis to the semipolar principal surface, the active layer including a gallium nitride-based semiconductor layer, a c-axis of the hexagonal group-III nitride semiconductor of the support base tilting at a finite angle ALPHA with respect to the normal axis toward an m-axis of the hexagonal group-III nitride semiconductor, the laser structure including first and second fractured faces, the first and second fractured faces intersecting with an m-n plane which is defined by the m-axis of the hexagonal group-III nitride semiconductor and the normal axis, the laser structure including a first surface, the first surface extending in a direction intersecting with the first or second fractured face, the laser structure including a second surface, the second surface being located on a side opposite to the first surface and extending along the first surface, the laser structure including first and second notches, the first and second notches being provided at respective ends of a first edge where the first surface and the first fractured face intersect, a laser cavity of the group-III nitride semiconductor laser device including the first and second fractured faces, the first fractured face extending from the first edge to an edge of the second surface, a first portion being included in a side wall surface of the first notch and connecting with the first edge, the first portion tilting at a gradient of a first tilt angle in a range of not less than 45° and not more than 85° with respect to the first surface toward the second surface, a second portion being included in a side wall surface of the second notch and connecting with the first edge, the second portion tilting at a gradient of a second tilt angle in a range of not less than 10° and not more than 30° with respect to the first surface toward the second surface, the first fractured face having a second edge, the second edge extending in a direction which intersects with the first edge, the second edge having an end on the first surface side, a quotient being obtained by dividing a distance from a bottom wall surface of the first notch to a virtual plane which extends along the first surface from the first surface above the bottom wall surface, by a distance from the first surface to the second surface, the quotient being in a range of not less than 0.05 and not more than 0.4, and a distance from an end of the first edge to a center line of the first fractured face which extends in the direction intersecting with the first edge, being in a range of not less than 30 μm and not more than 100 μm.

In this group-III nitride semiconductor laser device, because the first and second fractured faces that form the laser cavity intersect with the m-n plane defined by the normal axis and the m-axis of the hexagonal group-III nitride semiconductor, it is feasible to provide the laser waveguide extending in a direction of an intersecting line between the m-n plane and the semipolar surface. Therefore, the present invention succeeds in providing the group-III nitride semiconductor laser device with the laser cavity that enables a low threshold current.

In this group-III nitride semiconductor laser device, the angle ALPHA is in a range of not less than 45° and not more than 80° or in a range of not less than 100° and not more than 135°. In this group-III nitride semiconductor laser device, when the angle is in a range of less than 45° and in a range of more than 135°, end faces made by press are highly likely to be comprised of the m-planes. When the angle is in a range of more than 80° and less than 100°, it might result in failing to achieve desired flatness and perpendicularity.

In this group-III nitride semiconductor laser device, the angle ALPHA is in a range of not less than 63° and not more than 80° or in a range of not less than 100° and not more than 117°. In this group-III nitride semiconductor laser device, when the angle is in a range of not less than 63° and not more than 80°, or in a range of not less than 100° and not more than 117°, end faces made by press are highly likely to be faces nearly perpendicular to the principal surface of the substrate. When the angle is in a range of more than 80° and less than 100°, it might result in failing to achieve desired flatness and perpendicularity.

In this group-III nitride semiconductor laser device, a thickness of the support base is not more than 400 μm. This group-III nitride semiconductor laser device is preferred to obtain good-quality fractured faces for a laser cavity.

In this group-III nitride semiconductor laser device, a thickness of the support base is in a range of not less than 50 μm and not more than 100 μm. When the thickness is not less than 50 μm, handling becomes easier, and production yield becomes higher. When the thickness is not more than 100 μm, it is more preferred for obtaining good-quality fractured faces for a laser cavity.

In this group-III nitride semiconductor laser device, the semipolar principal surface slightly tilts at an angle in a range of not less than −4° and not more than +4° with respect to any one of {20-21} plane, {10-11} plane, {20-2-1} plane, and {10-11} plane. This group-III nitride semiconductor laser device allows for provision of the first and second end faces (fractured faces) with flatness and perpendicularity enough to construct a laser cavity of the group-III nitride semiconductor laser device, on one of these typical semipolar surfaces.

In this group-III nitride semiconductor laser device, a stacking fault density of the support base is not more than $1 \times 10^4$ cm$^{-1}$. In this group-III nitride semiconductor laser device, because the stacking fault density is not more than $1 \times 10^4$ cm$^{-1}$, the flatness and/or perpendicularity of the fractured faces is unlikely to be disturbed for a certain accidental reason.

In this group-III nitride semiconductor laser device, the support base comprises any one of GaN, AlGaN, AlN, InGaN, and InAlGaN. In this group-III nitride semiconductor laser device, when the substrate used is comprised of one of these GaN-based semiconductors, it becomes feasible to obtain the first and second end faces (fractured faces) applicable to a laser cavity. Use of an AlN substrate or AlGaN substrate allows for increase in the degree of polarization, and for the enhancement of optical confinement by virtue of low refractive index. Use of an InGaN substrate allows for decrease in the degree of lattice mismatch between the substrate and the light emitting layer, and for improvement in crystal quality.

This group-III nitride semiconductor laser device further comprises a dielectric multilayer film provided on at least one of the first and second fractured faces. In this group-III nitride semiconductor laser device, an end face coat is also applicable to the fractured faces. The end face coat allows for adjustment of reflectance.

In this group-III nitride semiconductor laser device, the active layer includes a light emitting region provided so as to generate light at a wavelength in a range of not less than 360 nm and not more than 600 nm. Since this group-III nitride semiconductor laser device makes use of the semipolar surface, the resultant device is the group-III nitride semiconductor laser device making efficient use of polarization in the LED mode, and achieves a low threshold current.

In this group-III nitride semiconductor laser device, the active layer includes a quantum well structure provided so as to generate light at a wavelength in a range of not less than 430 nm and not more than 550 nm. Since this group-III nitride semiconductor laser device makes use of the semipolar surface, it allows for increase in quantum efficiency through both decrease of the piezoelectric field and improvement in crystal quality of the light emitting layer region, and it is thus suitably applicable to generation of light at the wavelength of not less than 430 nm and not more than 550 nm.

Another aspect of the present invention relates to a method of fabricating a group-III nitride semiconductor laser device. This method comprises the steps of: preparing a substrate of a hexagonal group-III nitride semiconductor, the substrate having a semipolar principal surface; forming a substrate product having a laser structure, an anode electrode and a cathode electrode, the laser structure including the substrate and a semiconductor region, the semiconductor region being formed on the semipolar principal surface; scribing a first surface of the substrate product in part in a direction of an a-axis of the hexagonal group-III nitride semiconductor, thereby to make a plurality of scribed grooves in the first surface; carrying out breakup of the substrate product by press against a second surface of the substrate product, to form another substrate product and a laser bar; and processing end faces of the laser bar, and thereafter cutting the processed laser bar along cut planes which extend in a direction intersecting with the a-axis of the hexagonal group-III nitride semiconductor and which pass through the respective scribed grooves, to break the processed laser bar into a plurality of the group-III nitride semiconductor laser devices, the first surface being opposite to the second surface, the semiconductor region being located between the first surface and the substrate, the laser bar having first and second end faces, the first and second end faces being formed by the breakup, the first and second end faces extending from the first surface to the second surface, the first and second end faces constituting a laser cavity of the group-III nitride semiconductor laser device, the anode electrode and the cathode electrode being formed on the laser structure, the semiconductor region including a first cladding layer of a first conductivity type gallium nitride-based semiconductor, a second cladding layer of a second conductivity type gallium nitride-based semiconductor and an active layer, the active layer being provided between the first cladding layer and the second cladding layer, the first cladding layer, the second cladding layer, and the active layer being arranged along a normal axis to the semipolar principal surface, the active layer including a gallium nitride-based semiconductor layer, a c-axis of the hexagonal group-III nitride semiconductor of the substrate tilting at a finite angle ALPHA with respect to the normal axis toward an m-axis of the hexagonal group-III nitride semiconductor, the first and second end faces intersecting with an m-n plane which is defined by the m-axis of the hexagonal group-III nitride semiconductor and the normal axis, the scribing being carried out using a laser scriber, a plurality of scribed grooves being formed in the first surface by the scribing, a first portion being included in a side wall surface of the scribed groove and connecting with the first surface at one end of the scribed groove, the first portion tilting at a gradient of a first tilt angle in a range of not less than 45° and not more than 85° with respect to the first surface, a second portion being included in the side wall surface and connecting with the first surface at the other end of the scribed groove, the second portion tilting at a gradient of a second tilt angle in a range of not less than 10° and not more than 30° with respect to the first surface, a direction from the one end toward the other end of the scribed groove being a direction intersecting with a projected direction of the c-axis of the hexagonal group-III nitride semiconductor onto the semipolar principal surface, the breaking for the laser bar proceeded in the direction from the one end toward the other end of the scribed groove in the step of forming the other substrate product and the laser bar, a quotient being obtained by dividing a distance from a bottom wall surface of the scribed groove to a virtual plane which extends along the first surface from the first surface above the bottom wall surface, by a distance from the first surface to the second surface, the quotient being in a range of not less than 0.05 and not more than 0.4, and a distance from the one end or the other end of the scribed groove lying between the two cut planes adjoining in parallel, to a center plane between the two cut planes, being in a range of not less than 30 μm and not more than 100 μm.

According to this method, the first surface of the substrate product is scribed in the direction of the a-axis of the hexagonal group-III nitride semiconductor, and thereafter the substrate product is broken up by press against the second surface of the substrate product, thereby forming the other substrate product and the laser bar. For this reason, the laser bar is provided with the first and second end faces that intersect the m-n plane defined by the normal axis and the m-axis of the hexagonal group-III nitride semiconductor. This method of forming end faces provides the first and second end faces with flatness and perpendicularity enough to construct the laser cavity of the group-III nitride semiconductor laser device, or the laser cavity mirror faces without ion damage. In this method, the laser waveguide extends in the direction of tilt of the c-axis of the hexagonal group-III nitride, and the end faces of the laser cavity mirror capable of providing this laser waveguide are formed without use of dry-etched facets. Since the shape and arrangement of the scribed grooves are suitably controlled by the laser scriber, it becomes feasible to readily and stably form a plurality of devices of the same quality which have the laser cavity mirror faces with flatness and perpendicularity enough to construct the laser cavity, or without ion damage (so as to reduce variation in flatness and perpendicularity).

In this method, the angle ALPHA is in a range of not less than 45° and not more than 80° or in a range of not less than 100° and not more than 135°. When the angle falls within a range of less than 45° and within a range of more than 135°, the end faces formed by press are highly likely to be composed of the m-planes. When the angle falls within a range of more than 80° and less than 100°, desired flatness and perpendicularity are not achieved.

In this method, the angle ALPHA is in a range of not less than 63° and not more than 80° or in a range of not less than 100° and not more than 117°. When the angle is in a range of less than 63° and in a range of more than 117°, the m-plane can appear in part of the end face made by press. When the angle is in a range of more than 80° and less than 100°, desired flatness and perpendicularity are not achieved.

In this method, the step of forming the substrate product includes performing processing such as slicing or grinding of the substrate so that a thickness of the substrate becomes not more than 400 μm, and the second surface is one of the following: a processed surface formed by the processing; and a surface including an electrode formed on the processed surface, the step of forming the substrate product includes polishing the substrate so that a thickness of the substrate becomes not less than 50 μm and not more than 100 μm, and the second surface is one of the following: a polished surface formed by the polishing; and a surface including an electrode formed on the polished surface. With the substrate in such thickness, it is feasible to form the first and second end faces with flatness and perpendicularity enough to construct the laser cavity of the group-III nitride semiconductor laser device, or without ion damage, in good yield.

In this method, the semipolar principal surface is any one of {20-21} plane, {10-11} plane, {20-2-1} plane, and {10-1-1} plane. With these semipolar surfaces, it is also feasible to provide the first and second end faces with flatness and perpendicularity enough to construct the laser cavity of the group-III nitride semiconductor laser device, or without ion damage.

In this method, the substrate comprises any one of GaN, AlGaN, AlN, InGaN, and InAlGaN. This method allows the first and second end faces applicable to the laser cavity to be obtained through the use of the substrate comprised of one of these GaN-based semiconductors.

The above objects and other objects, features, and advantages of the present invention can more readily become clear in view of the following detailed description of the preferred embodiments of the present invention proceeding with reference to the accompanying drawings.

BRIEF DESCRIPTION OF THE DRAWINGS

FIG. 2 is a drawing showing a band structure in an active layer in the group-III nitride semiconductor laser device.

FIG. 7 is a drawing showing a scanning electron microscope image of a cavity end face, along with a {20-21} plane in crystal lattices.

FIG. 13 is a drawing showing angles between (20-21) plane and other plane orientations (indices).

DESCRIPTION OF THE PREFERRED EMBODIMENTS

The expertise of the present invention can be readily understood in view of the following detailed description with reference to the accompanying drawings provided by way of illustration only. The following will describe embodiments of the group-III nitride semiconductor laser device and the method of fabricating the group-III nitride semiconductor laser device according to the present invention, with reference to the accompanying drawings. The same portions will be denoted by the same reference symbols if possible.

Figure 1:
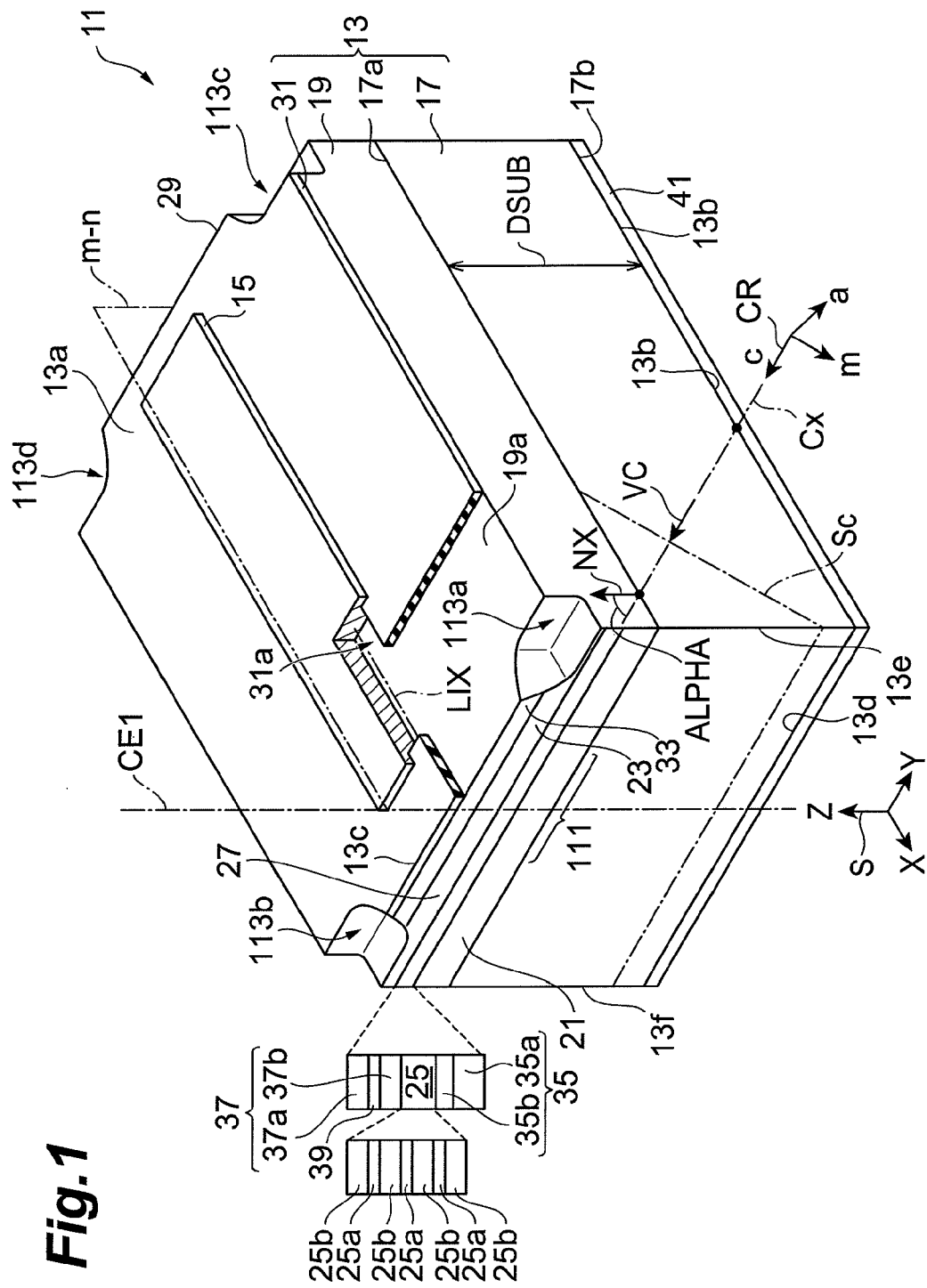
FIG. 1 is a drawing schematically showing a structure of a group-III nitride semiconductor laser device according to an embodiment of the present invention.

FIG. 1 is a drawing schematically showing a structure of a group-III nitride semiconductor laser device according to an embodiment of the present invention. The group-III nitride semiconductor laser device 11 has a gain-guiding type structure, but embodiments of the present invention are not limited to the gain-guiding type structure. The group-III nitride semiconductor laser device 11 has a laser structure 13 and an electrode 15. The laser structure 13 includes a support base 17, a semiconductor region 19 and an insulating film 31. The support base 17 comprises a hexagonal group-III nitride semiconductor and has a semipolar principal surface 17a and a back surface 17b. The semiconductor region 19 is provided on the semipolar principal surface 17a of the support base 17. The electrode 15 is provided on the semiconductor region 19 of the laser structure 13. The semiconductor region 19 includes a first cladding layer 21, a second cladding layer 23 and an active layer 25. The first cladding layer 21 comprises a first conductivity type gallium nitride based semiconductor, e.g., n-type AlGaN, n-type InAlGaN, or the like. The second cladding layer 23 comprises a second conductivity type GaN-based semiconductor, e.g., p-type AlGaN, p-type InAlGaN, or the like. The active layer 25 is provided between the first cladding layer 21 and the second cladding layer 23. The active layer 25 includes gallium nitride based semiconductor layers, and the gallium nitride based semiconductor layers are, for example, well layers 25a. The active layer 25 includes barrier layers 25b of a gallium nitride based semiconductor, and the well layers 25a and the barrier layers 25b are alternately arranged. The well layers 25a comprise, for example, of InGaN or the like and the barrier layers 25b, for example, GaN, InGaN, or the like. The active layer 25 can include a quantum well structure provided so as to generate light at the wavelength of not less than 360 nm and not more than 600 nm, and making use of the semipolar surface is suitably applicable to generation of light at the wavelength of not less than 430 nm and not more than 550 nm. The first cladding layer 21, the second cladding layer 23, and the active layer 25 are arranged along an axis NX normal to the semipolar principal surface 17a. In the group-III nitride semiconductor laser device 11, the laser structure 13 includes a first fractured face 27 and a second fractured face 29, which intersect with an m-n plane defined by the normal axis NX and the m-axis of the hexagonal group-III nitride semiconductor.

Referring to FIG. 1, an orthogonal coordinate system S and a crystal coordinate system CR are depicted. The normal axis NX is directed along a direction of the Z-axis of the orthogonal coordinate system S. The semipolar principal surface 17a extends in parallel with a predetermined plane defined by the X-axis and the Y-axis of the orthogonal coordinate system S. In FIG. 1, a typical c-plane Sc is also depicted. The c-axis of the hexagonal group-III nitride semiconductor of the support base 17 tilts at an angle ALPHA with respect to the normal axis NX toward the m-axis of the hexagonal group-III nitride semiconductor.

The insulating film 31 covers a surface 19a of the semiconductor region 19 of the laser structure 13, and the semiconductor region 19 is located between the insulating film 31 and the support base 17. The support base 17 comprises a hexagonal group-III nitride semiconductor. The insulating film 31 has an opening 31a, and the opening 31a extends in a direction of an intersecting line LIX between the surface 19a of the semiconductor region 19 and the foregoing m-n plane, and has, for example, a stripe shape. The electrode 15 is in contact with the surface 19a of the semiconductor region 19 (e.g., a contact layer 33 of the second conductivity type) through the opening 31a, and extends in the direction of the foregoing intersecting line LIX. The laser structure 13 further includes a waveguide 111. The waveguide 111 includes the first cladding layer 21, the second cladding layer 23, and the active layer 25, and extends along the electrode 15 in the direction of the intersecting line LIX. The waveguide 111 extends from the first fractured face 27 to the second fractured face 29 along a projected direction of the c-axis of the hexagonal group-III nitride semiconductor onto the semipolar principal surface 17a (which is a direction intersecting with the a-axis of the hexagonal group-III nitride semiconductor).

In the group-III nitride semiconductor laser device 11, the first fractured face 27 and the second fractured face 29 intersect with the m-n plane defined by the m-axis of the hexagonal group-III nitride semiconductor and the normal axis NX. A laser cavity of the group-III nitride semiconductor laser device 11 includes the first and second fractured faces 27 and 29, and the laser waveguide extends from one of the first fractured face 27 and the second fractured face 29 to the other. The laser structure 13 has a first surface and a second surface 13b. The first surface 13a extends in a direction intersecting with the first fractured face 27 or the second fractured face 29. The second surface 13b is located on the side opposite to the first surface 13a, and extends along the first surface 13a. The first surface 13a is a surface of the insulating film 31. The second surface 13b is a surface included in the support base 17 and making a junction with electrode 41. The first and second fractured faces 27, 29 extend from an edge 13c of the first surface 13a to an edge 13d of the second surface 13b. The first and second fractured faces 27, 29 are different from the conventional cleaved facets like c-planes, m-planes, or a-planes.

In this group-III nitride semiconductor laser device 11, the first and second fractured faces 27, 29 that form the laser cavity intersect with the m-n plane. This allows for provision of the laser waveguide extending in the direction of the intersecting line between the m-n plane and the semipolar surface 17a. For this reason, the group-III nitride semiconductor laser device 11 has the laser cavity enabling a low threshold current.

The group-III nitride semiconductor laser device 11 includes an n-side optical guide layer 35 and a p-side optical guide layer 37. The n-side optical guide layer 35 includes a first portion 35a and a second portion 35b, and the n-side optical guide layer 35 comprises, for example, of GaN, InGaN, or the like. The p-side optical guide layer 37 includes a first portion 37a and a second portion 37b, and the p-side optical guide layer 37 comprises, for example, of GaN, InGaN, or the like. A carrier block layer 39 is provided, for example, between the first portion 37a and the second portion 37b. Another electrode 41 is provided on the back surface 17b of the support base 17, and the electrode 41 covers, for example, the back surface 17b of the support base 17.

Figure 3:
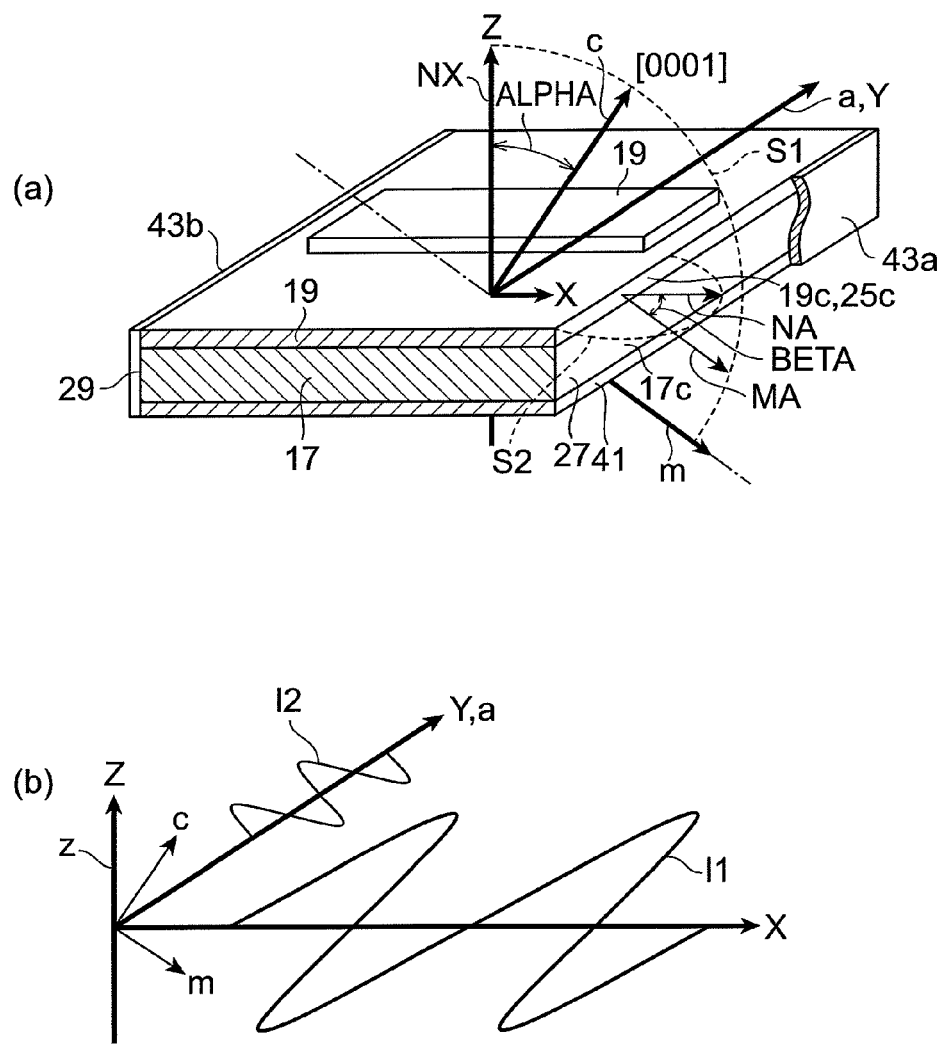
FIG. 3 is a drawing showing polarization of emission in the active layer of the group-III nitride semiconductor laser device.
Figure 4:
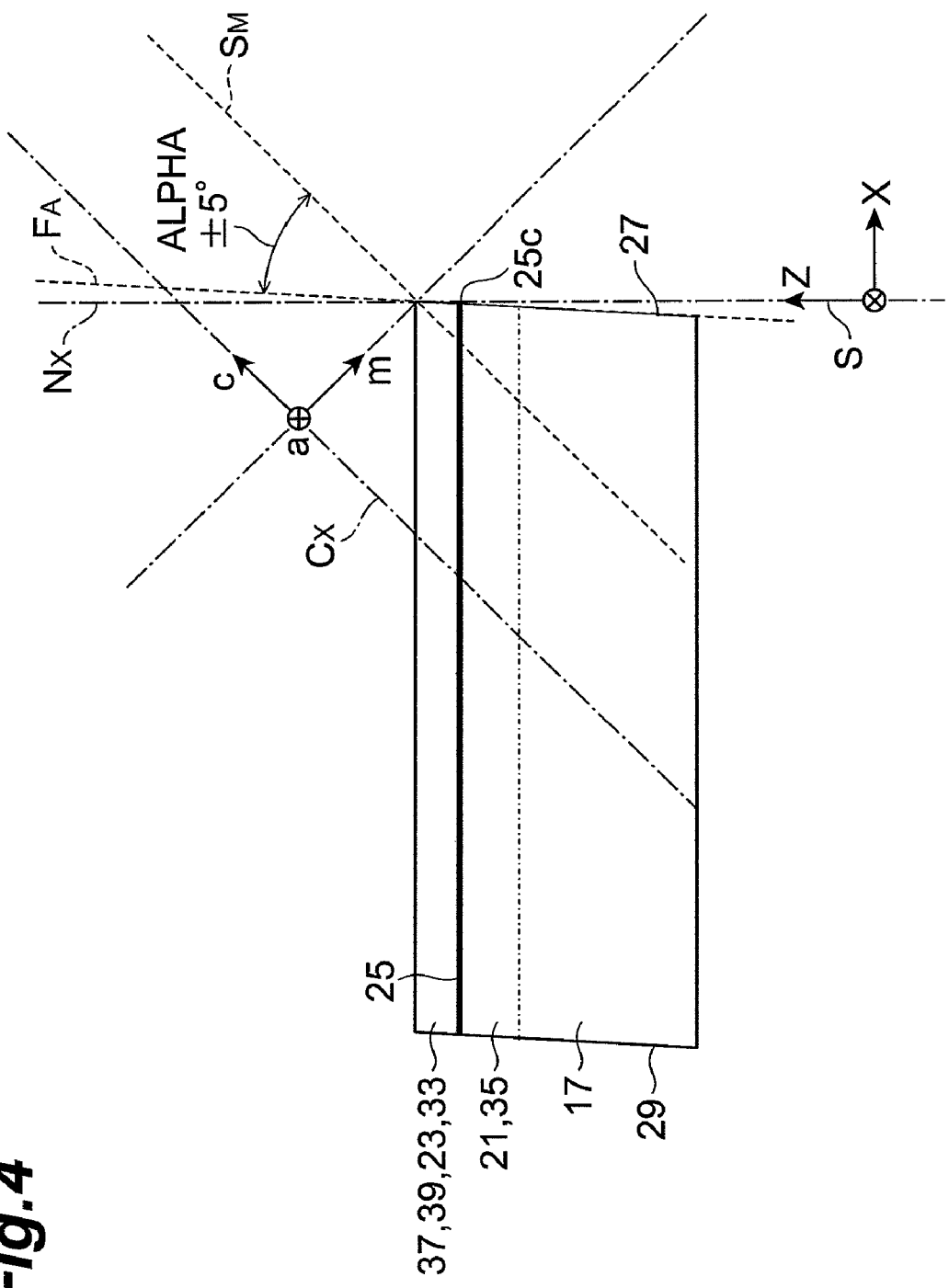
FIG. 4 is a drawing showing a relation between an end face of the group-III nitride semiconductor laser device and an m-plane of the active layer.

FIG. 2 is a drawing showing a band structure in the active layer in the group-III nitride semiconductor laser device. FIG. 3 is a drawing showing polarization of emission from the active layer 25 of the group-III nitride semiconductor laser device 11. FIG. 4 is a schematic cross sectional view taken along a plane defined by the c-axis and the m-axis. With reference to Part (a) of FIG. 2, three possible transitions between the conduction band and valence bands in the vicinity of Γ point of the band structure BAND are shown. The energy difference between band A and band B is relatively small. An emission by transition Ea between the conduction band and band A is polarized in the a-axis direction, and an emission by transition Eb between the conduction band and band B is polarized in a direction of the c-axis projected onto the principal surface. Concerning lasing, a threshold of transition Ea is smaller than a threshold of transition Eb.

With reference to Part (b) of FIG. 2, there are shown spectra of light in the LED mode in the group-III nitride semiconductor laser device 11. The light in the LED mode includes a polarization component I1 in the direction of the a-axis of the hexagonal group-III nitride semiconductor, and a polarization component I2 in the direction of the projected c-axis of the hexagonal group-III nitride semiconductor onto the principal surface, and the polarization component I1 is larger than the polarization component I2. Degree of polarization p is defined by (I1−I2)/(I1+I2). The laser cavity of the group-III nitride semiconductor laser device 11 enables the device to emit a laser beam in the mode that has large emission intensity in the LED mode.

As shown in FIG. 3, the device may be further provided with dielectric multilayer film 43a, 43b on at least one of the first and second fractured faces 27, 29 or on the respective faces. An end face coating is also applicable to the fractured faces 27, 29. The end face coating allows adjustment of their reflectance.

As shown in Part (b) of FIG. 3, the laser light L from the active layer 25 is polarized in the direction of the a-axis of the hexagonal group-III nitride semiconductor. In this group-III nitride semiconductor laser device 11, a band transition allowing for implementation of a low threshold current has polarized nature. The first and second fractured faces 27, 29 for the laser cavity are different from the conventional cleaved facets like c-planes, m-planes, or a-planes. But, the first and second fractured faces 27, 29 have flatness and perpendicularity as mirrors for lasing cavity. For this reason, by using the first and second fractured faces 27, 29 and the laser waveguide extending between these fractured faces 27, 29, as shown in Part (b) of FIG. 3, it becomes feasible to achieve low-threshold lasing through the use of the emission by transition Ea stronger than the emission by transition Eb that is polarized in the direction indicated by the c-axis projected onto the principal surface.

In the group-III nitride semiconductor laser device 11, an end face 17c of the support base 17 and an end face 19c of the semiconductor region 19 are exposed in each of the first and second fractured faces 27 and 29, and the end face 17c and the end face 19c are covered with the dielectric multilayer film 43a. An angle BETA between an m-axis vector MA of the active layer 25 and a vector NA normal to the end face 17c of the support base 17, and an end face 25c in the active layer 25 has a component $(BETA)_1$ defined on a first plane S1, which is defined by the c-axis and m-axis of the group-III nitride semiconductor, and a component $(BETA)_2$ defined on a second plane S2 (which is not shown but is referred to as "S2" for easier understanding), which is perpendicular to the first plane S1 (which is not shown but is referred to as "S1" for easier understanding) and the normal axis NX. The component $(BETA)_1$ is preferably in a range of not less than (ALPHA−5)° and not more than (ALPHA+5)° in the first plane S1 defined by the c-axis and m-axis of the group-III nitride semiconductor. This angular range is shown as an angle between a typical m-plane $S_M$ and a reference plane $F_A$ in FIG. 4. The typical m-plane $S_M$ is depicted from the inside to the outside of the laser structure in FIG. 4, for easier understanding. The reference plane $F_A$ extends along the end face 25c of the active layer 25. This group-III nitride semiconductor laser device 11 has the end faces in which the angle BETA taken from one of the c-axis and the m-axis to the other satisfies the aforementioned perpendicularity. The component $(BETA)_2$ is preferably in a range of not less than −5° and not more than +5° on the second plane S2. Here, $BETA^2=(BETA)_1^2+(BETA)_2^2$. The end faces 27 and 29 of the group-III nitride semiconductor laser device 11 satisfy the aforementioned perpendicularity as to the in-plane angle defined in the plane that is perpendicular to the normal axis NX to the semipolar surface 17a.

Referring again to FIG. 1, in the group-III nitride semiconductor laser device 11, the thickness DSUB of the support base 17 is preferably not more than 400 μm. This group-III nitride semiconductor laser device can provide good-quality fractured faces for the laser cavity. In the group-III nitride semiconductor laser device 11, the thickness DSUB of the support base 17 is more preferably not less than 50 μm and not more than 100 μm. This group-III nitride semiconductor laser device 11 can be provided good-quality fractured faces more preferred for the laser cavity. Furthermore, its handling becomes easier and the production yield can be improved.

In the group-III nitride semiconductor laser device 11, the angle ALPHA between the normal axis NX and the c-axis of the hexagonal group-III nitride semiconductor is preferably not less than 45° and preferably not more than 80°. Furthermore, the angle ALPHA is preferably not less than 100° and preferably not more than 135°. When the angle is in a range of less than 45° and in a range of more than 135°, the end faces made by press are highly likely to be comprised of m-planes.

When the angle is in a range of more than 80° and less than 100°, it could result in failing to achieve desired flatness and perpendicularity.

In the group-III nitride semiconductor laser device 11, more preferably, the angle ALPHA between the normal axis NX and the c-axis of the hexagonal group-III nitride semiconductor is not less than 63° and not more than 80°. Furthermore, the angle ALPHA is particularly preferably not less than 100° and not more than 117°. When the angle is in a range of less than 63° and in a range of more than 117°, an m-plane can be formed in part of an end face made by press. When the angle is in a range of more than 80° and less than 100°, it could result in failing to achieve desired flatness and perpendicularity.

The semipolar principal surface 17a can be any one of {20-21} plane, {10-11} plane, {20-2-1} plane and {10-1-1} plane. Furthermore, a surface with a slight tilt in a range of not less than −4° and not more than +4° with respect to these planes may also be applied as the principal surface. On the semipolar surface 17a of one of these typical planes, it is feasible to provide the first and second fractured faces 27 and 29 with flatness and perpendicularity enough to construct the laser cavity of the group-III nitride semiconductor laser device 11. Furthermore, end faces with sufficient flatness and perpendicularity are obtained in an angular range across these typical plane orientations.

In the group-III nitride semiconductor laser device 11, the stacking fault density of the support base 17 can be not more than $1\times10^4$ cm$^{-1}$. Since the stacking fault density is not more than $1\times10^4$ cm$^{-1}$, the flatness and/or perpendicularity of the fractured faces is less likely to be disturbed for a certain accidental reason. The support base 17 can comprise any one of GaN, AlN, AlGaN, InGaN, and InAlGaN. When the substrate of any one of these GaN-based semiconductors is used, the first and second fractured faces 27 and 29 applicable to the cavity can be obtained. When an AlN or AlGaN substrate is used, it is feasible to increase the degree of polarization and to enhance optical confinement by virtue of low refractive index. When an InGaN substrate is used, it is feasible to decrease degree of the lattice mismatch between the substrate and the light emitting layer and to improve crystal quality.

Figure 17:
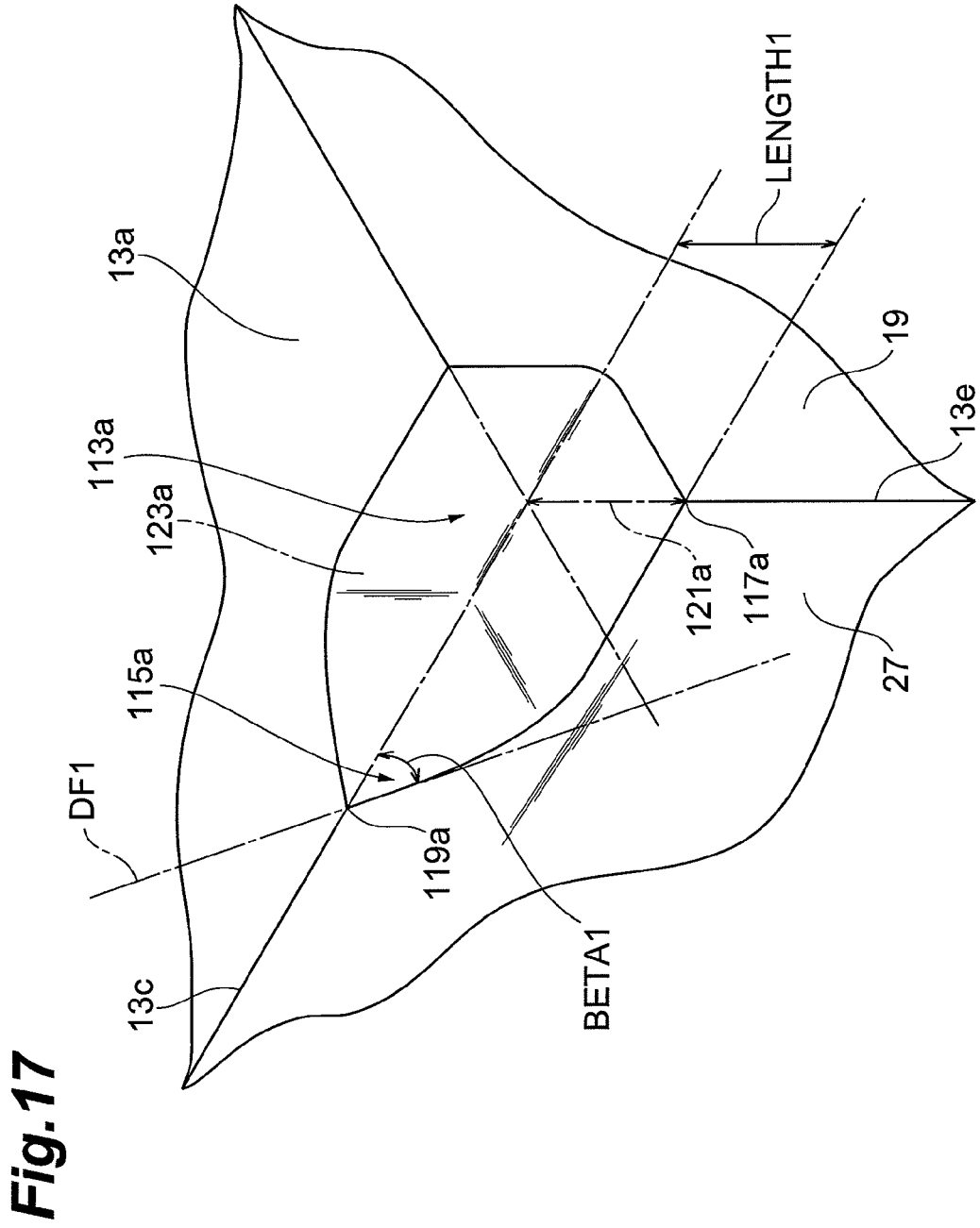
FIG. 17 is a drawing showing a general view of one notch in the group-III nitride semiconductor laser device according to the embodiment.

The laser structure 13 further has a notch 113a, a notch 113b, a notch 113c, and a notch 113d. The notch 113a is provided at one end of the edge 13c where the first surface 13a and the first fractured face 27 intersect, and the notch 113b is provided at the other end of the edge 13c. The notch 113c has the same configuration as the notch 113a, and the notch 113d has the same configuration as the notch 113b. Therefore, the description of the notches 113c and 113d will be omitted below for simplicity of description. Each notch such as the notch 113a and the notch 113b is a part of a scribed groove made with a laser scriber 10a in a fabrication process of the group-III nitride semiconductor laser device 11. The notches 113a to 113d can be referred to as notches as described above, and they can also be referred to as pits provided at the four corners of the first surface 13a (or two ends of each edge such as the edge 13c) in the laser structure 13. Furthermore, they can also be referred to as depressed portions provided at the four corners of the first surface 13a (or two ends of each edge such as the edge 13c) in the laser structure 13. In FIG. 17, the configuration of the notch 113a is shown, and in FIG. 18, the configuration of the notch 113b is shown.

First, the notch 113a will be described with reference to FIG. 17. A portion 115a included in a side wall surface of the notch 113a and connecting with the edge 13c tilts at a gradient of an tilt angle BETA1 falling within a range of not less than 45° and not more than 85°, with respect to the first surface 13a toward the second surface 13b. The tilt angle BETA1 is, more specifically, an angle between the edge 13c and a tangent line DF1 to an edge as an intersection between the first fractured face 27 and the portion 115a of the side wall surface of the notch 113a (i.e., a tangent at an intersection with the edge 13c). The first fractured face 27 has an edge 13e, and the edge 13e extends in a direction intersecting with the edge 13c. The edge 13e has an end 117a on the first surface 13a side. A quotient (LENGTH1/THICKNESS1) is obtained by dividing a distance (LENGTH1) from a bottom wall surface of the notch 113a to a virtual plane 123a extending along the first surface 13a from the first surface 13a above the bottom wall surface, by a distance (THICKNESS1) from the first surface 13a to the second surface 13b. The quotient (LENGTH1/THICKNESS1) is in a range of not less than 0.05 and not more than 0.4. Of distances from the virtual plane 123a to the bottom wall surface of the notch 113a, for example, the largest value can be used as the distance LENGTH1. Of distances from the first surface 13a to the second surface 13b, for example, the largest value can be used as the distance THICKNESS1. It is also possible to use a length of a virtual line 121a extending along the edge 13e from the end 117a of the edge 13e to the virtual plane 123a, instead of the distance LENGTH1. The bottom wall surface of the notch 113a and the virtual plane 123a can be parallel.

Figure 18:
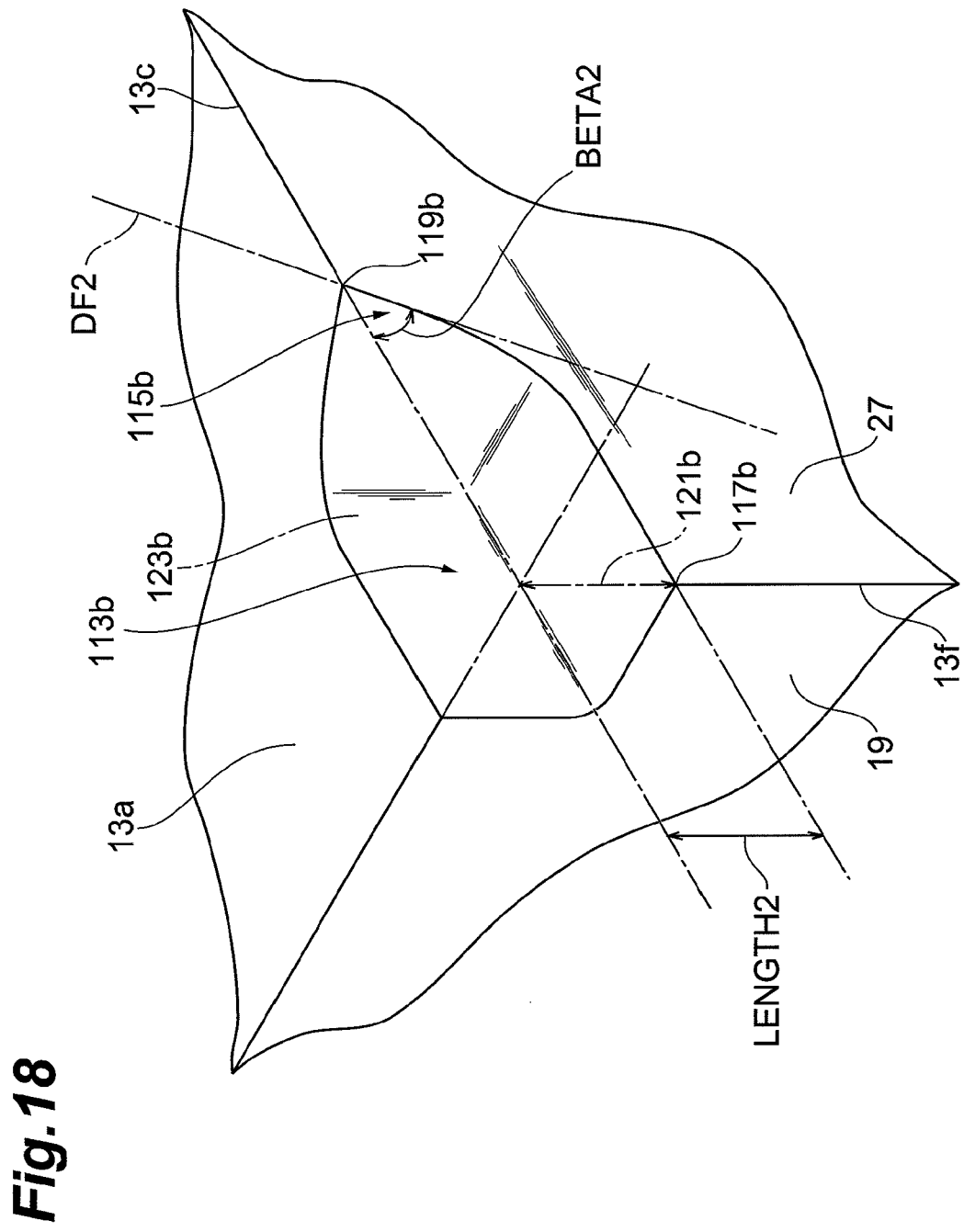
FIG. 18 is a drawing showing a general view of another notch in the group-III nitride semiconductor laser device according to the present embodiment.

Next, the notch 113b will be described with reference to FIG. 18. A portion 115b included in a side wall surface of the notch 113b and connecting with the edge 13c tilts at a gradient of an tilt angle BETA2 falling within a range of not less than 10° and not more than 30°, with respect to the first surface 13a toward the second surface 13b. The tilt angle BETA2 is, more specifically, an angle between the edge 13c and a tangent line DF2 to an edge as an intersection between the first fractured face 27 and the portion 115b of the side wall surface of the notch 113b (i.e., a tangent at an intersection with the edge 13c). The tilt angle BETA1 is larger than the tilt angle BETA2. The first fractured face 27 has an edge 13f, and the edge 13f extends in a direction intersecting with the edge 13c. The edge 13f has an end 117b on the first surface 13a side. A quotient (LENGTH2/THICKNESS1) is obtained by dividing a distance (LENGTH2) from a bottom wall surface of the notch 113b to a virtual plane 123b extending along the first surface 13a from the first surface 13a above the bottom wall surface, by the distance from the first surface 13a to the second surface 13b (THICKNESS1). The quotient (LENGTH2/THICKNESS1) is in a range of not less than 0.05 and not more than 0.4. Of distances from the virtual plane 123b to the bottom wall surface of the notch 113b, for example, the largest value can be used as the distance LENGTH2. Of distances from the first surface 13a to the second surface 13b, for example, the largest value can be used as the distance THICKNESS1. It is also possible to use a length of a virtual line 121b extending along the edge 13f from the end 117b of the edge 13f to the virtual plane 123b, instead of the distance LENGTH2. The bottom wall surface of the notch 113b and the virtual plane 123b can be parallel.

A distance from the end 119a to a center line CE1 of the first fractured face 27 (cf. FIG. 1) is in a range of not less than 30 µm and not more than 100 µm, and a distance from the end 119b to the center line CE1 of the first fractured face 27 is also in a range of not less than 30 µm and not more than 100 µm. The center line CE1 is located between the edge 13e and the edge 13f in the first fractured face 27, and extends in a direction intersecting with the edge 13c. The center line CE1 extends in parallel with the edge 13e or the edge 13f. A difference between a distance from the center line CE1 to the edge 13e and a distance from the center line CE1 to the edge 13f is small, and thus the two distances can be said to be approximately equal.

Figure 5:
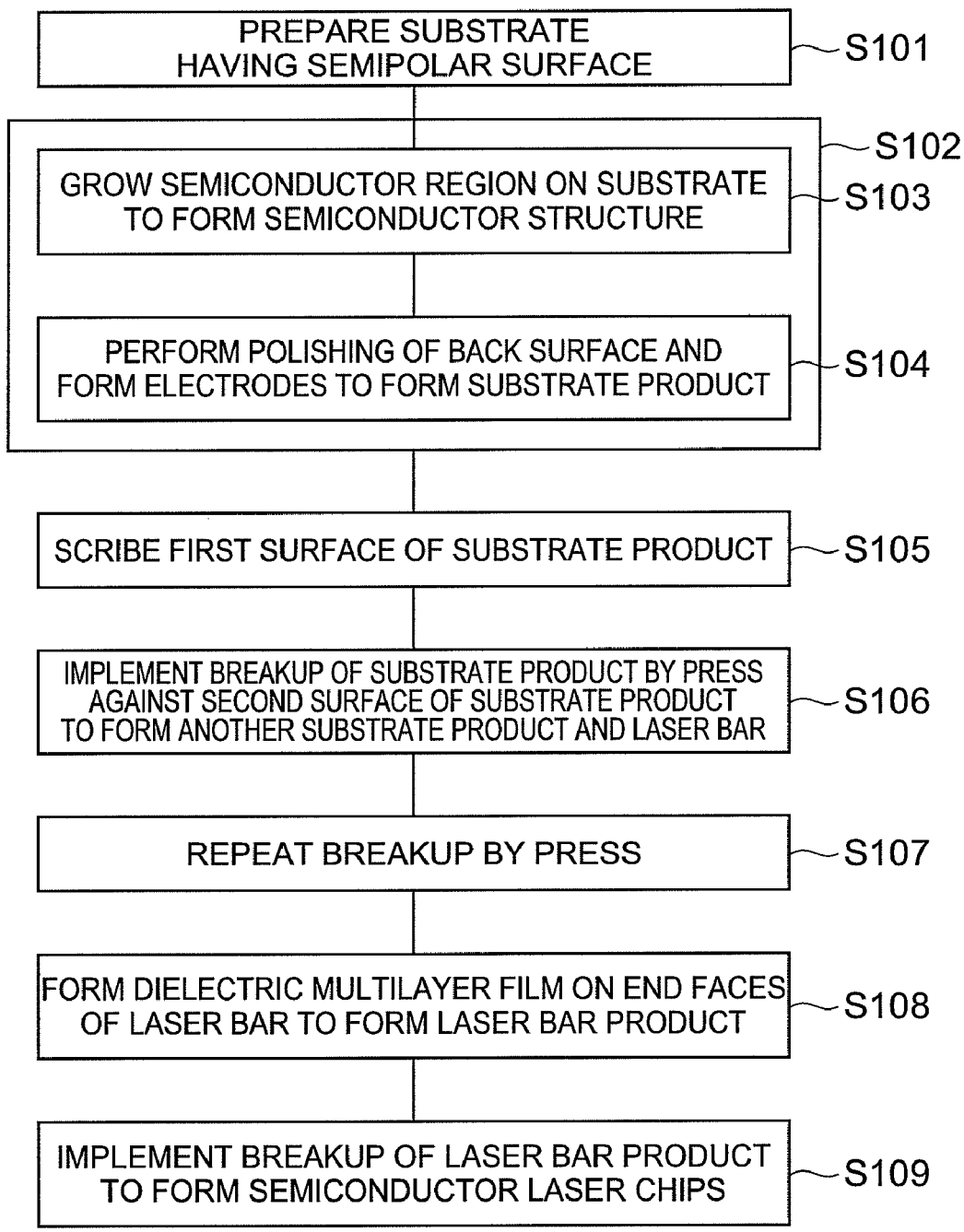
FIG. 5 is a flowchart showing major steps in a method of fabricating the group-III nitride semiconductor laser device according to the embodiment.

FIG. 5 is a drawing showing major steps in a method of fabricating the group-III nitride semiconductor laser device according to the present embodiment. With reference to Part (a) of FIG. 6, a substrate 51 is shown. In step S101, the substrate 51 is prepared for fabrication of the group-III nitride semiconductor laser device. The c-axis (vector VC) of the hexagonal group-III nitride semiconductor of the substrate 51 tilts at an angle ALPHA with respect to the normal axis NX toward the m-axis (vector VM) of the hexagonal group-III nitride semiconductor. Accordingly, the substrate 51 has a semipolar principal surface 51a of the hexagonal group-III nitride semiconductor.

In step S102, a substrate product SP is formed. In Part (a) of FIG. 6, the substrate product SP is depicted as a member of a nearly disklike shape, but the shape of the substrate product SP is not limited thereto. For obtaining the substrate product SP, step S103 is first performed to form a laser structure 55. The laser structure 55 includes a semiconductor region 53 and an insulating film 54, and in step S103, the semiconductor region 53 is grown on the semipolar principal surface 51a. For forming the semiconductor region 53, a first conductivity type GaN-based semiconductor region 57, a light emitting layer 59, and a second conductivity type GaN-based semiconductor region 61 are grown sequentially on the semipolar principal surface 51a. The GaN-based semiconductor region 57 can include, for example, an n-type cladding layer and the GaN-based semiconductor region 61 can include, for example, a p-type cladding layer. The light emitting layer 59 is provided between the GaN-based semiconductor region 57 and the GaN-based semiconductor region 61, and can include an active layer, optical guide layers, an electron block layer, and so on. The GaN-based semiconductor region 57, the light emitting layer 59, and the second conductivity type GaN-based semiconductor region 61 are arranged in the direction of the normal axis NX to the semipolar principal surface 51a. These semiconductor layers are epitaxially grown thereon. The surface of the semiconductor region 53 is covered with an insulating film 54. The insulating film 54 comprises, for example, of silicon oxide. The insulating film 54 has an opening 54a. The opening 54a has, for example, a stripe shape.

Step S104 is carried out to form an anode electrode 58a and a cathode electrode 58b on the laser structure 55. Before forming the electrode on the back surface of the substrate 51, the back surface of the substrate used in crystal growth is polished to form a substrate product SP in desired thickness DSUB. In formation of the electrodes, for example, the anode electrode 58a is formed on the semiconductor region 53, and the cathode electrode 58b is formed on the back surface (polished surface) 51b of the substrate 51. The anode electrode 58a extends in the X-axis direction, and the cathode electrode 58b covers the entire area of the back surface 51b. After these steps, the substrate product SP is obtained. The substrate product SP includes a first surface 63a, and a second surface 63b located opposite thereto. The semiconductor region 53 is located between the first surface 63a and the substrate 51.

Figure 6:
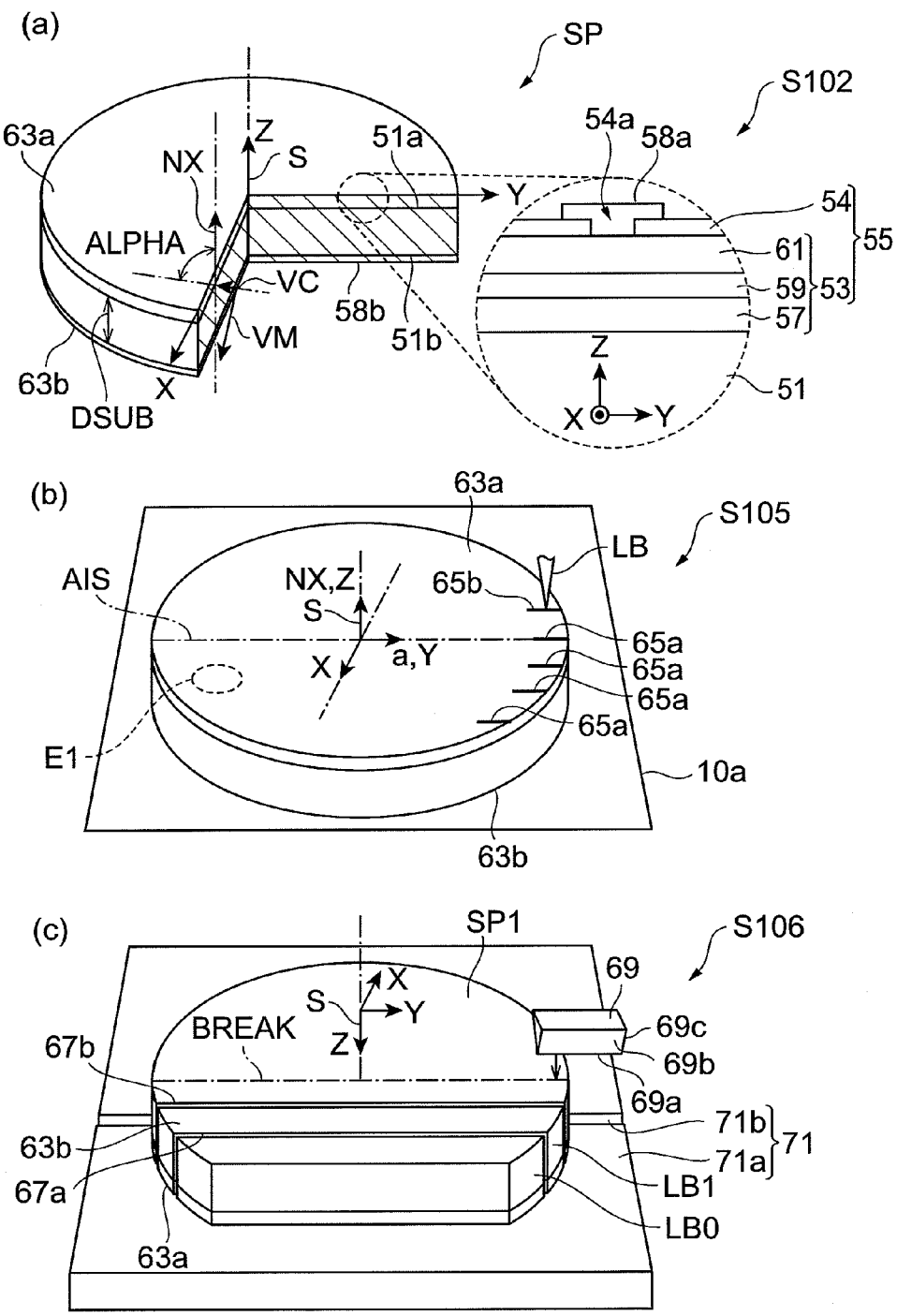
FIG. 6 is a drawing schematically showing major steps in the method of fabricating the group-III nitride semiconductor laser device according to the embodiment.

Step S105 is carried out, as shown in Part (b) of FIG. 6, to scribe the first surface 63a of the substrate product SP. This scribing step is carried out with a laser scriber 10a. This scribing step forms scribed grooves 65a. In Part (b) of FIG. 6, five scribed grooves are already formed, and formation of a scribed groove 65b is in progress with laser beam LB. The length of the scribed grooves 65a is shorter than the length of an intersecting line MS between the first surface 63a and an a-n plane defined by the normal axis NX and the a-axis of the hexagonal group-III nitride semiconductor, and the laser beam LB is applied to a part of the intersecting line MS. By the application with the laser beam LB, grooves extending in the specific direction and reaching the semiconductor region are formed in the first surface 63a. The scribed grooves 65a can be formed, for example, in an edge of the substrate product SP.

Figure 19:
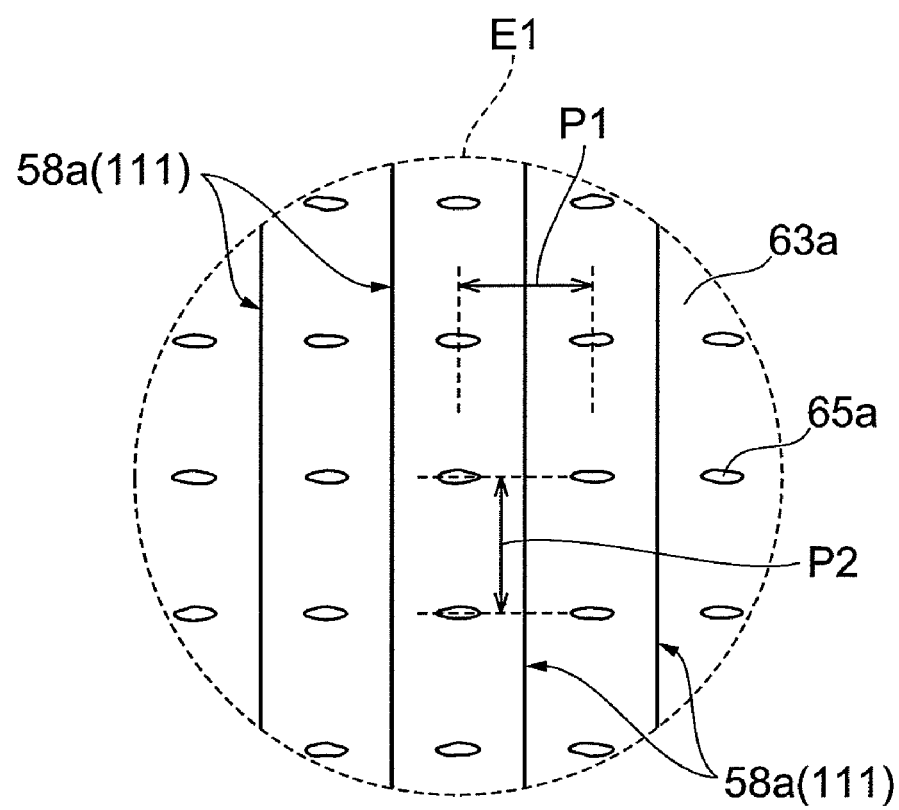
FIG. 19 is a drawing showing a structure of a substrate surface produced in a fabrication process of the group-III nitride semiconductor laser device according to the embodiment.

The configuration of the first surface 63a of the substrate product SP will be specifically described. In FIG. 19, an example of the configuration of the first surface 63a of the substrate product SP is shown. In FIG. 19, the configuration in a region E1 included in the first surface 63a is illustrated. The configuration in the region E1 illustrated in FIG. 19 is the configuration throughout the first surface 63a, and is not limited to the specific region. As shown in FIG. 19, a plurality of anode electrodes 58a are provided, for example, in parallel on the first surface 63a, and a plurality of scribed grooves 65a are provided, for example, at equal intervals between two adjacent anode electrodes 58a. The substrate product SP includes a plurality of waveguides (corresponding to waveguides 111), and each waveguide extends along the anode electrode 58a in the semiconductor region 53. The extending direction of the anode electrode 58a is the projected direction of the c-axis of the hexagonal group-III nitride semiconductor onto the semipolar principal surface 51a (or the first surface 63a), and the extending direction of the anode electrode 58a is direction intersecting with the a-axis of the hexagonal group-III nitride semiconductor. The plurality of scribed grooves 65a are arranged at a pitch P1 (e.g., a pitch in a range of not less than 300 μm and not more than 500 μm and, preferably, about 400 μm) in a direction (the extending direction of the a-axis of the hexagonal group-III nitride semiconductor) intersecting with the extending direction of the anode electrodes 58a, and arranged at a pitch P2 (e.g., a pitch in a range of not less than 400 μm and not more than 800 μm and, preferably, about 600 μm) along the extending direction of the anode electrodes 58a. Since the scribed grooves 65a are regularly and accurately formed on the first surface 63a of the substrate product SP by the laser scriber 10a as described above, variation is reduced in the shape of laser bar LB1 or the like (and the group-III nitride semiconductor laser device 11) to be separated from the substrate product SP.

Description will continue referring back to FIG. 6. As shown in Part (c) of FIG. 6, step S106 is carried out to implement breakup of the substrate product SP by press against the second surface 63b of the substrate product SP, thereby forming a substrate product SP1 and a laser bar LB1. The press is carried out with a breaking device, such as, a blade 69. The blade 69 includes an edge 69a extending in one direction, and at least two blade faces 69b and 69c that are formed to define the edge 69a. The pressing onto the substrate product SP1 is carried out on a support device 71. The support device 71 includes a support table 71a and a recess 71b, and the recess 71b extends in one direction. The recess 71b is formed in the support table 71a. The orientation and position of the scribed groove 65a of the substrate product SP1 are aligned with the extending direction of the recess 71b of the support device 71 to position the substrate product SP1 to the recess 71b on the support device 71. The orientation of the edge of the breaking device is aligned with the extending direction of the recess 71b, and the edge of the breaking device is pressed against the substrate product SP1 from a direction intersecting with the second surface 63b. The intersecting direction is preferably an approximately vertical direction to the second surface 63b. This implements the breakup of the substrate product SP to form the substrate product SP1 and laser bar LB1. The press results in forming the laser bar LB1 with first and second end faces 67a and 67b, and these end faces 67a and 67b have perpendicularity and flatness enough to make at least a part of the light emitting layer applicable to mirrors for the laser cavity of the semiconductor laser.

The laser bar LB1 thus formed has the end faces 67a, 67b formed by the aforementioned breakup, and each of the end faces 67a, 67b extends from the end face 63a to the end face 63b. The end faces 67a, 67b form the laser cavity of the group-III nitride semiconductor laser device, and intersect with the XZ plane. This XZ plane corresponds to the m-n plane defined by the normal axis NX and the m-axis of the hexagonal group-III nitride semiconductor.

By use of this method, the first surface 63a of the substrate product SP is scribed in the direction of the a-axis of the hexagonal group-III nitride semiconductor, and thereafter the breakup of the substrate product SP is carried out by press against the second surface 63b of the substrate product SP, thereby forming the new substrate product SP1 and the laser bar LB1. This method allows the formation of the first and second end faces 67a, 67b, which intersect with the m-n plane, in the laser bar LB1. This end face forming method provides the first and second end faces 67a, 67b with flatness and perpendicularity enough to construct the laser cavity of the group-III nitride semiconductor laser device.

In this method, the laser waveguide thus formed extends in the direction of inclination of the c-axis of the hexagonal group-III nitride. The end faces of the laser cavity mirror allowing for provision of this laser waveguide are formed without use of dry-etching.

This method involves the fracturing of the substrate product SP1, thereby forming the new substrate product SP1 and the laser bar LB1. In Step S107, the breakup is repeatedly carried out by press to produce a number of laser bars. This fracture propagates along the scribed grooves 65a shorter than a fracture line BREAK of the laser bar LB1.

Figure 20:
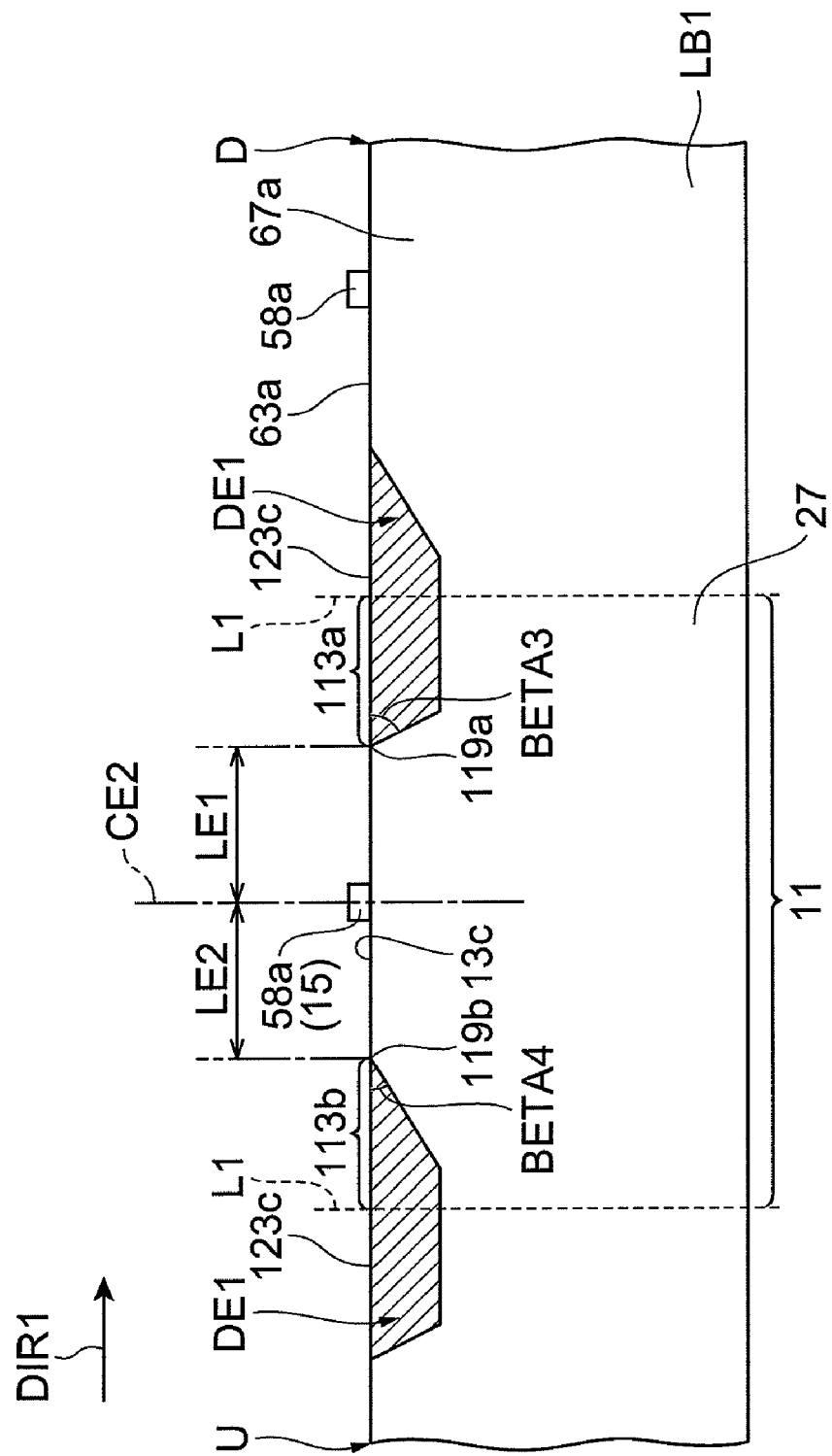
FIG. 20 is a drawing showing a configuration on an end face side of a laser bar produced in a fabrication process of the group-III nitride semiconductor laser device according to the present embodiment.

In FIG. 20, the configuration of the end face 67a of the laser bar LB1 is illustrated. Each notch DE1 is formed from a scribed groove 65a during the formation of the laser bar such as the laser bar LB1 (which will be called breaking in some cases below) (by the process of separating the laser bar LB1 or the like from the substrate product SP or the like in step S106 and step S107), and is a portion which has formed the scribed groove 65a before the formation of the laser bar. Therefore, the notch DE1 can be taken as the scribed groove 65a below. Since the description with replacement of the notch DE1 with the scribed groove 65a is the same as the description of the notch DE1, it will be omitted below for simplicity of description.

Notches DE1 and anode electrodes 58a are alternately arranged in a direction DIR1 intersecting with the extending direction of the anode electrodes 58a (the direction DIR1 is a direction intersecting with the projected direction of the c-axis of the hexagonal group-III nitride semiconductor onto the semipolar principal surface 51a, and can also be referred to as the extending direction of the a-axis of the hexagonal group-III nitride semiconductor). The separation of the laser bar such as the laser bar LB1 proceeds along the direction DIR1 from the side indicated by symbol U in the drawing toward the side indicated by symbol D in the drawing, in step S106 and step S107. The direction DIR1 from one end (end on the side indicated by symbol U in the drawing) to the other end (end on the side indicated by symbol D in the drawing) of the scribed groove 65a is the direction intersecting with the projected direction of the c-axis of the hexagonal group-III nitride semiconductor onto the semipolar principal surface 51a (which can also be referred to as the extending direction of the a-axis of the hexagonal group-III nitride semiconductor).

Each notch DE1 has a first portion (corresponding to the end 119a and referred to hereinafter as a U-side portion) which is included in a side wall surface of the notch DE1 and connects with the first surface 63a at one end of the notch DE1 (the end on the side indicated by symbol U in the drawing). Each notch DE1 has a portion (corresponding to the end 119b and referred to hereinafter as a D-side portion) which is included in a side wall surface of the notch DE1 and connects with the first surface 63a at the other end of the notch DE1 (the end on the side indicated by symbol D in the drawing). The U-side portion of the side wall surface of the notch DE1 tilts at a gradient of an tilt angle BETA3 (corresponding to the tilt angle BETA1) which falls within a range of not less than 45° and not more than 85°, with respect to the first surface 63a. The D-side portion of the side wall surface of the notch DE1 tilts at a gradient of an tilt angle BETA4 (corresponding to the tilt angle BETA2) which falls within a range of not less than 10° and not more than 30°, with respect to the first surface 63a. The tilt angle BETA3 is larger than the tilt angle BETA4. A quotient (LENGTH3/THICKNESS2) is obtained by dividing a distance (LENGTH3) from a bottom wall surface of the notch DE1 to a virtual plane 123c extending along the first surface 63a from the first surface 63a above the bottom wall surface, by a distance (THICKNESS2) from the first surface 63a to the second surface 63b. The quotient (LENGTH3/THICKNESS2) is in a range of not less than 0.05 and not more than 0.4.

The laser bar such as the laser bar LB1 is processed in step S108 described below, and thereafter the laser bar is cut along cut planes L1 which extend in the direction intersecting with the a-axis of the hexagonal group-III nitride semiconductor and pass through the respective scribed grooves 65a, in step S109 described below, to be broken up into a plurality of group-III nitride semiconductor laser devices 11. The cut planes L1 are arranged in parallel at equal intervals, e.g., at the pitch P1. A distance LE1 from the U-side portion of the scribed groove 65a between two cut planes L1 adjoining in parallel to a center plane CE2 between the two cut planes L1, is in a range of not less than 30 μm and not more than 100 μm. A distance LE2 from the D-side portion of the scribed groove 65a between two cut planes L1 adjoining in parallel to the center plane CE2 between the two cut planes L1, is also in a range of not less than 30 μm and not more than 100 μm. The center plane CE2 is a center plane between two cut planes L1 adjoining in parallel, and extends in the direction intersecting with the a-axis of the hexagonal group-III nitride semiconductor. An intersecting line between the center plane CE2 and the end face 67a corresponds to the aforementioned center line CE1. The notch DE1 is cut along the cut plane L1 thereby to form the notch 113a and notch 113b.

Therefore, since the shape and arrangement of scribed grooves 65a are suitably controlled by the laser scriber 10a, it is feasible to readily and stably form a plurality of devices of the same quality which have the laser cavity mirror faces with flatness and perpendicularity enough to construct the laser cavity, or without ion damage (so as to reduce variation in flatness and perpendicularity). The shape of the scribed grooves 65a can be schematically regarded as the shape of a ship's hull with a flat bottom. It can also be said that an end on a side indicated by symbol D in the drawing corresponds to a stem of the hull, and that an end on a side indicated by symbol U in the drawing corresponds to a stern of the hull.

In Step S108, dielectric multilayer films is formed on the end faces 67a, 67b of the laser bar LB1 to form a laser bar product. In Step S109, this laser bar product is separated into individual semiconductor laser dies. More specifically, in step S109, the laser bar product is cut along the cut planes L1 to break up the laser bar product into a plurality of group-III nitride semiconductor laser devices 11.

In the fabrication method according to the present embodiment, the angle ALPHA can be in a range of not less than 45° and not more than 80° and in a range of not less than 100° and not more than 135°. When the angle is in a range of less than 45° and in a range of more than 135°, the end face made by press becomes highly likely to be comprised of an m-plane. When the angle is in a range of more than 80° and less than 100°, it may result in failing to achieve desired flatness and perpendicularity. More preferably, the angle ALPHA can be in a range of not less than 63° and not more than 80° and in a range of not less than 100° and not more than 117°. When the angle is in a range of less than 45° and in a range of more than 135°, an m-plane can be formed in part of an end face formed by press. When the angle is in a range of more than 80° and less than 100°, it may result in failing to achieve desired flatness and perpendicularity. The semipolar principal surface 51a can be any one of {20-21} plane, {10-11} plane, {20-2-1} plane, and {10-1-1} plane. Furthermore, a surface slightly tilted in a range of not less than −4° and not more than +4° from the above planes is also used as the principal surface. On these typical semipolar surfaces, it is feasible to provide the end faces for the laser cavity with flatness and perpendicularity enough to construct the laser cavity of the group-III nitride semiconductor laser device.

The substrate 51 can be made of any one of GaN, AlN, AlGaN, InGaN, and InAlGaN. When any one of these GaN-based semiconductors is used for the substrate, it is feasible to obtain the end faces applicable to the laser cavity. The substrate 51 is preferably made of GaN.

In the step S104 of forming the substrate product SP, the semiconductor substrate used in crystal growth can be one subjected to processing such as slicing or grinding so that the substrate thickness becomes not more than 400 μm, whereby the second surface 63b of the semiconductor substrate becomes a processed surface formed by polishing. In this substrate thickness, the end faces 67a, 67b can be formed in good yield, and are provided with flatness and perpendicularity enough to construct the laser cavity of the group-III nitride semiconductor laser device or without ion damage. More preferably, the second surface 63b can be is a polished surface formed by polishing, and the thickness of the polished substrate is not more than 100 μm. For facilitating to handle the substrate product SP, the substrate thickness is preferably not less than 50 μm.

In the production method of the laser end faces according to the present embodiment, the angle BETA explained with reference to FIG. 3 can be also defined in the laser bar LB1. In the laser bar LB1, the component (BETA)$_1$ of the angle BETA is preferably in a range of not less than (ALPHA−5)° and not more than (ALPHA+5)° on a first plane (plane corresponding to the first plane S1 in the description with reference to FIG. 3) defined by the c-axis and m-axis of the group-III nitride semiconductor. The end faces 67a, 67b of the laser bar LB1 satisfy the aforementioned perpendicularity as to the angle component of the angle BETA taken from one of the c-axis and the m-axis to the other. The component (BETA)$_2$ of the angle BETA is preferably in a range of not less than −5° and not more than +5° on a second plane (plane corresponding to the second plane S2 shown in FIG. 3). These end faces 67a, 67b of the laser bar LB1 also satisfy the aforementioned perpendicularity as to the angle component of the angle BETA defined on the plane perpendicular to the normal axis NX to the semipolar surface 51a.

The end faces 67a, 67b are formed by break by press against the plurality of GaN-based semiconductor layers epitaxially grown on the semipolar surface 51a. Since they are epitaxial films on the semipolar surface 51a, each of the end faces 67a, 67b are not cleaved facets each having a low plane index like c-planes, m-planes, or a-planes which have been used heretofore for the conventional laser cavity mirrors. However, through the break of the stack of epitaxial films on the semipolar surface 51a, the end faces 67a, 67b have flatness and perpendicularity applicable as laser cavity mirrors.

Example 1

A GaN substrate with a semipolar surface is prepared, and perpendicularity of a fractured facet is observed as described below. The above substrate used has a {20-21}-plane GaN substrate formed by cutting a (0001) GaN ingot, thickly grown by HYPE, at the angle of 75° to the m-axis. The principal surface of the GaN substrate is mirror-finished, and the back surface has pear-skin which is finished by grinding. The thickness of the substrate is 370 μm.

On the back side in the pear-skin state, a scribed groove is formed perpendicularly to the projected direction of the c-axis on the principal surface of the substrate, with a diamond pen, and thereafter the substrate is fractured by press. For observing the perpendicularity of the resultant fractured face, the substrate is observed from the a-plane direction with a scanning electron microscope.

Part (a) of FIG. 7 shows a scanning electron microscope image of the fractured face observed from the a-plane direction, and the fractured face is shown as the right end face. As seen from the image, the fractured face has flatness and perpendicularity to the semipolar principal surface.

Example 2

Figure 8:
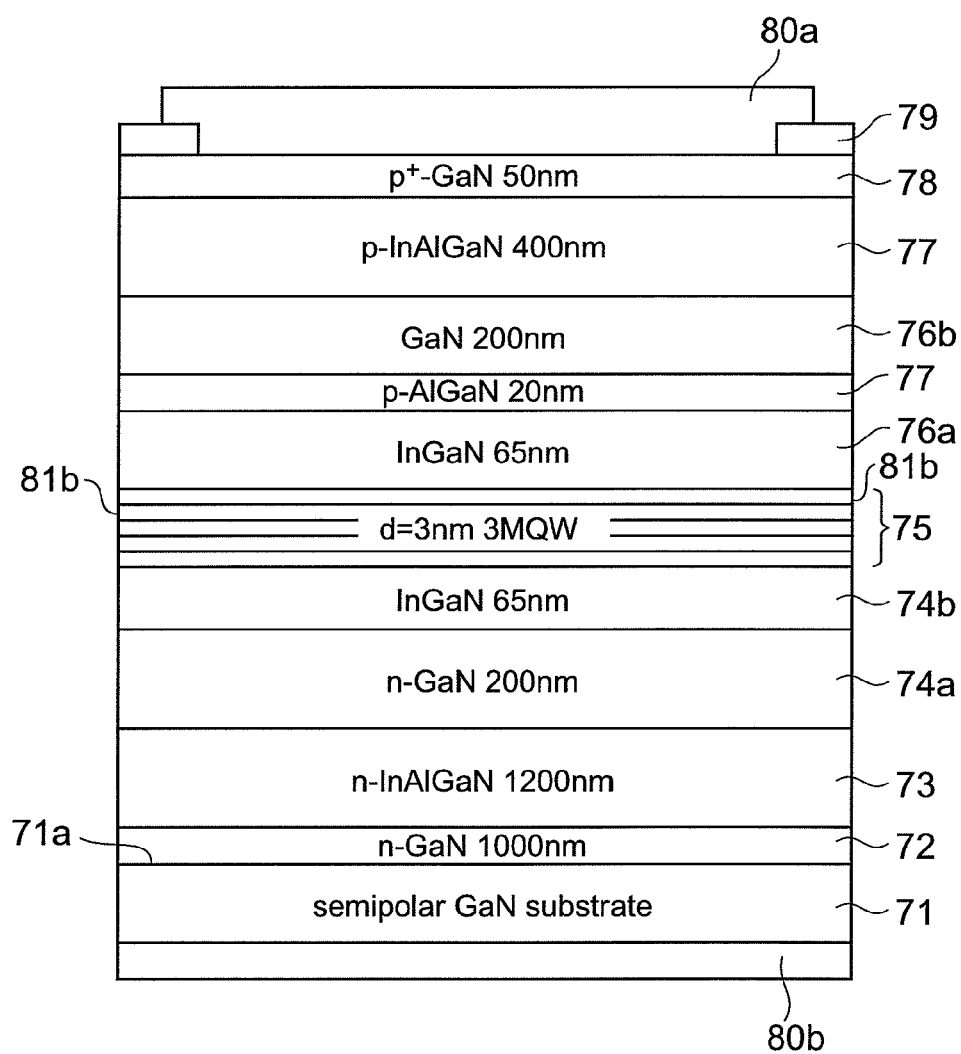
FIG. 8 is a drawing showing a structure of a laser diode shown in Example 1.

It is found in Example 1 that in the GaN substrate having the semipolar {20-21} plane, the fractured face obtained by forming the scribed groove perpendicular to the projected direction of the c-axis on the principal surface of the substrate and by pressing the substrate, has the flatness and perpendicularity in the principal surface of the substrate. For estimating applicability of this fractured face to the laser cavity, a laser diode shown in FIG. 8 is grown by organometallic vapor phase epitaxy as described below. The raw materials used are as follows: trimethyl gallium (TMGa); trimethyl aluminum (TMAl); trimethyl indium (TMIn); ammonia ($NH_3$); and silane ($SiH_4$). A substrate 71 is prepared. A GaN substrate is prepared as the substrate 71, and the GaN substrate is cut with a wafer slicing apparatus at an angle in a range of 0° to 90° to the m-axis from a (0001) GaN ingot thickly grown by HVPE, in such a manner that the angle ALPHA of the c-axis tilted toward the m-axis has a desired off angle in a range of 0° to 90°. For example, when the substrate is formed by cutting at the angle of 75°, the resultant substrate is prepared as a GaN substrate having a {20-21}-plane, and it is represented by reference symbol 71a in the hexagonal crystal lattice shown in Part (b) of FIG. 7.

Before the growth, the substrate is observed by the cathodoluminescence method in order to estimate the stacking fault density of the substrate. In the cathodoluminescence, an emission process of carriers excited by an electron beam is observed and in a stacking fault, non-radiative recombination of carriers occurs in the vicinity thereof, so that the stacking fault is expected be observed as a dark line. The stacking fault density is defined as a density (line density) per unit length of dark lines observed. The cathodoluminescence method of nondestructive measurement is applied herein in order to estimate the stacking fault density, but it is also possible to use destructive measurement, such as a transmission electron microscope. When a cross section of a sample is observed from the a-axis direction with the transmission electron microscope, a defect extending in the m-axis direction from the substrate toward the sample surface indicates a stacking fault contained in the support base, and the line density of stacking faults can be determined in the same manner as in the cathodoluminescence method.

The above substrate 71 is placed on a susceptor in a reactor, and the epitaxial layers are grown in the following growth procedure. First, an n-type GaN 72 is grown thereon and its the thickness is 1000 nm. Next, an n-type InAlGaN cladding layer 73 is grown thereon and its thickness is 1200 nm. Thereafter, an n-type GaN guide layer 74a and an undoped InGaN guide layer 74b are grown, their thickness are 200 nm and 65 nm, respectively, and then a three-cycle MQW 75 constituted by GaN 15 nm thick/InGaN 3 nm thick is grown thereon. Subsequently grown thereon are an undoped InGaN guide layer 76a of the thickness of 65 nm, a p-type AlGaN block layer 77 of the thickness of 20 nm, and a p-type GaN guide layer 76b of the thickness of 200 nm. Then, a p-type InAlGaN cladding layer 77 is grown thereon, and its thickness is 400 nm. Finally, a p-type GaN contact layer 78 is grown thereon and its thickness is 50 nm.

An insulating film 79 of $SiO_2$ is deposited on the contact layer 78 and then photolithography and wet etching processes are applied to form a stripe window having the width of 10 μm in the insulating film 79. In this step, two types of contact windows are formed in two stripe directions, respectively. These laser stripes are formed in the following directions: (1) M-direction (direction of the contact window extending along the predetermined plane defined by the c-axis and the m-axis); and (2) A-direction: <11-20> direction.

After the formation of the stripe window, a p-side electrode 80a of Ni/Au and a pad electrode of Ti/Al are made by vapor deposition. Next, the back surface of the GaN substrate (GaN wafer) is polished using diamond slurry to produce a substrate product with the mirror-polished back surface. Then, the thickness of the thus formed substrate product is measured with a contact film thickness meter. The measurement of substrate thickness may also be carried out with a microscope from the observation of a cross section of a prepared sample. The microscope applicable herein can be an optical microscope or a scanning electron microscope. An n-side electrode 80b of Ti/Al/Ti/Au is formed by vapor deposition on the back surface (polished surface) of the GaN substrate (GaN wafer).

The laser cavity mirrors for these two types of laser stripes are produced with a laser scriber that uses the YAG laser at the wavelength of 355 nm. When the break is implemented with the laser scriber, the laser chip yield can be improved as compared with break implemented using a diamond scriber. The conditions for formation of the scribed grooves are as follows: laser beam output power of 100 mW; scanning speed of 5 mm/s. The scribed grooves thus formed each has, for example, the length of 30 μm, the width of 10 μm, and the depth of 40 μm. The scribed grooves are formed by applying the laser beam through the aperture of the insulating film of the substrate directly to the epitaxially grown surface at the pitch of 400 μm. The cavity length is 600 μm.

The laser cavity mirrors are made through fracture by use of a blade. A laser bar is produced by break by press against the back side of the substrate. More specifically, Parts (b) and (c) of FIG. 7 show relations between crystal orientations and fractured faces, for the {20-21}-plane GaN substrate. Part (b) of FIG. 7 shows the laser stripe that is provided to extend (1) in the M-direction, and shows end faces 81a, 81b for the laser cavity along with the semipolar surface 71a. The end faces 81a, 81b are approximately perpendicular to the semipolar surface 71a, but are different from the conventional cleaved facets like the hitherto used c-planes, m-planes, or a-planes. Part (c) of FIG. 7 shows the laser stripe that is provided to extend (2) in the <11-20> direction, and shows end faces 81c, 81d for the laser cavity along with the semipolar surface 71a. The end faces 81c, 81d are approximately perpendicular to the semipolar surface 71a and are composed of a-planes.

The fractured faces made by break are observed with a scanning electron microscope, and no prominent unevenness is observed in each of (1) and (2). From this result, the flatness (magnitude of unevenness) of the fractured faces can be not more than 20 nm. Furthermore, the perpendicularity of the fractured faces to the surface of the sample can be within a range of ±5°.

The end faces of the laser bar are coated with a dielectric multilayer film by vacuum vapor deposition. The dielectric multilayer film is composed of an alternate stack of $SiO_2$ and $TiO_2$. The thickness of each layer is adjusted in a range of not less than 50 and not more than 100 nm, and is designed so that the center wavelength of reflectance fell within a range of not less than 500 nm and not more than 530 nm. The reflecting surface on one side has ten cycles and the designed value of reflectance of about 95%, and the reflecting surface on the other side has six cycles and the designed value of reflectance of about 80%.

The devices thus formed are energized to make their evaluation at room temperature. A pulsed power source is used as a power supply for the energization, and supplies pulses with the pulse width of 500 ns and the duty ratio of 0.1%, and the energization is implemented through probing needles that are in contact with the surface electrodes. In light output measurement, an emission from the end face of the laser bar is detected with a photodiode to obtain a current-light output characteristic (I-L characteristic). In measurement of emission wavelength, the emission from the end face of the laser bar is supplied through an optical fiber to a spectrum analyzer of a detector to measure a spectrum thereof. In estimation of a polarization, the emission from the laser bar is made to pass through a polarizing plate by rotation, thereby determining the polarization state. In observation of LED-mode emission, an optical fiber is aligned to the front surface side of the laser bar to measure optical emission from the front surface.

The polarization in the laser beam is measured for every laser device, and it is found that the laser beam is polarized in the a-axis direction. The laser wavelength is in a range of not less than 500 nm and not more than 530 nm.

Figure 9:
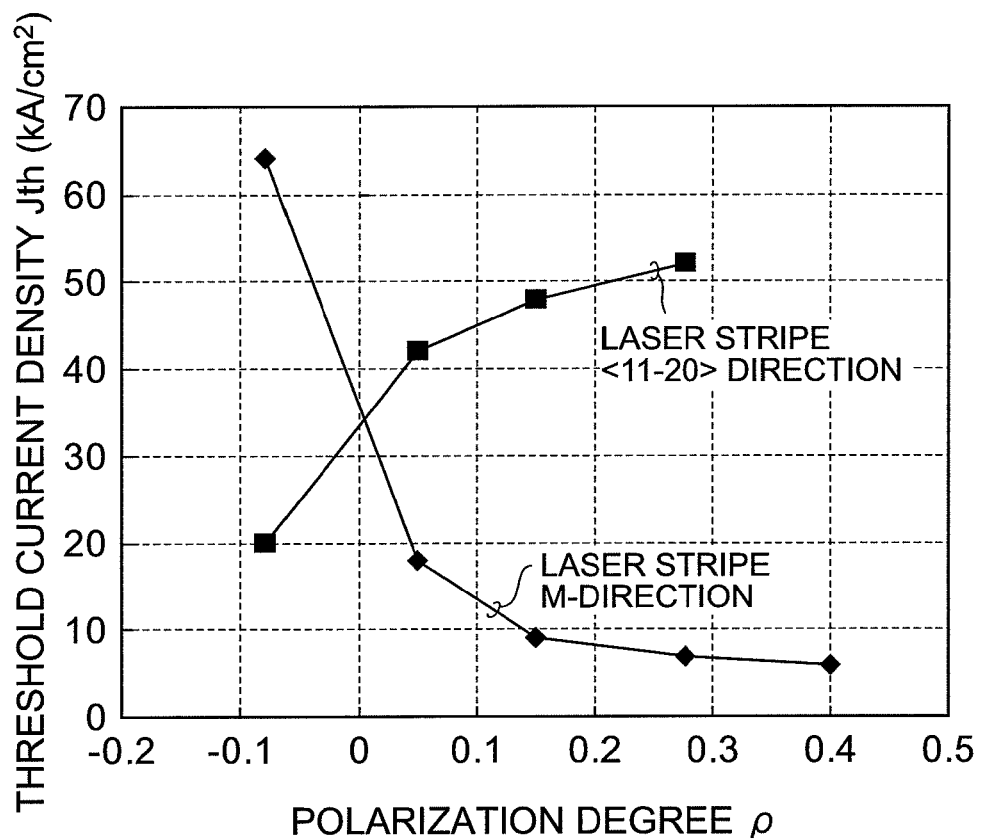
FIG. 9 is a drawing showing a relation of determined polarization degree ρ versus threshold current density.

The polarization state in the LED mode (i.e., spontaneous emission) is measured for every laser device. When the polarization component in the a-axis direction is referred to as I1, and the polarization component in the direction of the projected m-axis onto the principal surface is referred to as I2, the polarization degree ρ is defined as (I1−I2)/(I1+I2). The relation between determined polarization degree p and minimum of threshold current density is investigated, and the result obtained is shown in FIG. 9. As seen from FIG. 9, the threshold current density demonstrates a significant decrease in the laser (1) with the laser stripe along the M-direction when the polarization degree is positive. Namely, it is seen that when the polarization degree is positive (I1>I2) and the waveguide is provided along an off direction, the threshold current density is significantly decreased. The data shown in FIG. 9 is as follows.

| Polarization degree, | Threshold current (M-direction stripe), | Threshold current (<11-20> stripe); |
|---|---|---|
| 0.08, | 64, | 20; |
| 0.05, | 18, | 42; |
| 0.15, | 9, | 48; |
| 0.276, | 7, | 52; |
| 0.4, | 6 | |

Figure 10:
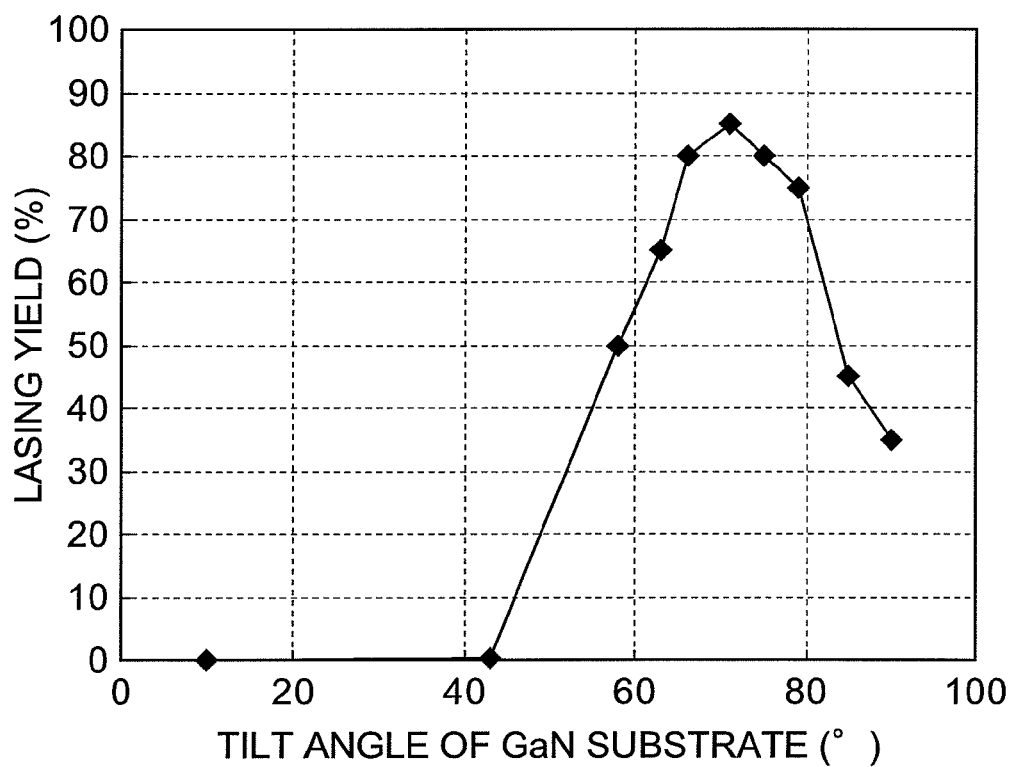
FIG. 10 is a drawing showing a relation of tilt angles of the c-axis toward the m-axis of GaN substrate versus lasing yield.

The relation between the tilt angle of the c-axis of the GaN substrate toward the m-axis, and lasing yield is investigated, and the result thus obtained is shown in FIG. 10. In the present example, the lasing yield is defined as (the number of laser chips)/(the number of measured chips). FIG. 10 is a plot for substrates, having the stacking fault density of substrate of not more than $1\times10^4$ (cm$^{-1}$), on which lasers with the laser stripe along (1) the M-direction are formed. As seen from FIG. 10, the lasing yield is extremely low in the off angles of not more than 45°. The observation of the end faces with an optical microscope finds that an m-plane is formed in almost all chips at the tilt angles smaller than 45°, resulting in failure in achieving perpendicularity. The observation also finds that when the off angle is in a range of not less than 63° and not more than 80°, the perpendicularity is improved and the lasing yield increases to 50% or more. From these experimental results, the optimum range of off angle of the GaN substrate is not less than 63° and not more than 80°. The same result is also obtained in a range of not less than 100° and not more than 117°, which is an angular range to provide crystallographically equivalent end faces. The data shown in FIG. 10 is as follows.

| Tilt angle, | Yield; |
|---|---|
| 10, | 0.1; |
| 43, | 0.2; |
| 58, | 50; |
| 63, | 65; |
| 66, | 80; |
| 71, | 85; |
| 75, | 80; |
| 79, | 75; |
| 85, | 45; |
| 90, | 35 |

Figure 11:
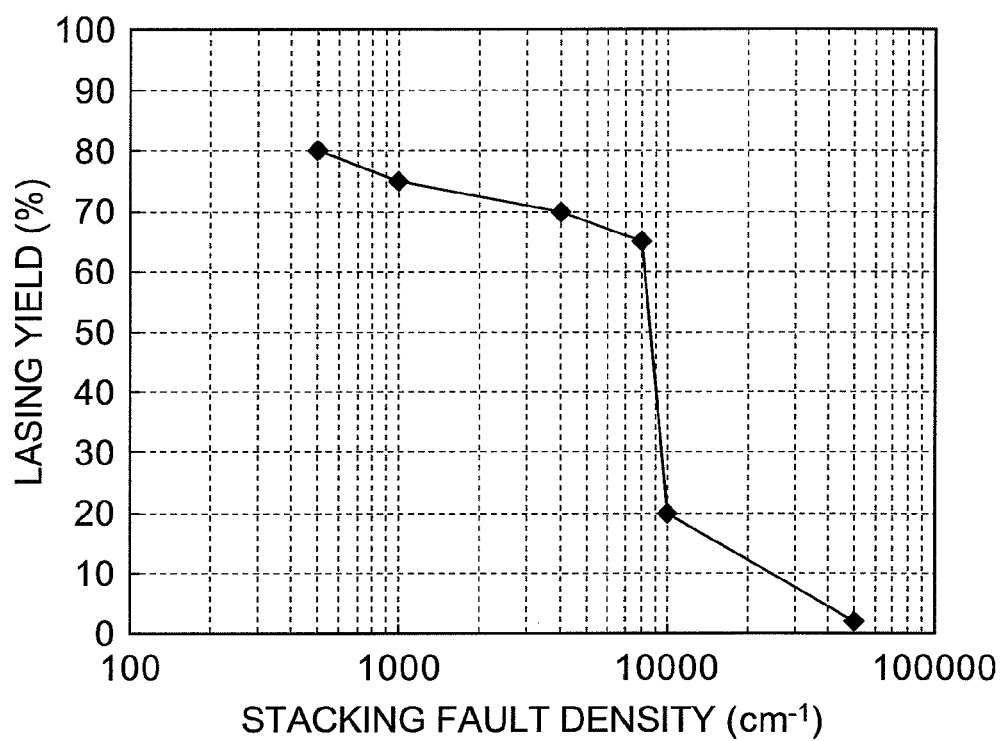
FIG. 11 is a drawing showing a relation of stacking fault density versus lasing yield.

The relation between stacking fault density and lasing yield is investigated and the result obtained is shown in FIG. 11. The definition of lasing yield is the same as above. As seen from FIG. 11, the lasing yield is suddenly decreased with the stacking fault density over $1\times10^4$ (cm$^{-1}$). The observation of the end face state with an optical microscope shows that devices in the sample group categorized as decreased lasing yield exhibits the significant unevenness of the end faces, so that no flat fractured faces are obtained. The reason therefor is that a difference in easiness of fracture depends on the existence of stacking faults. From this result, the stacking fault density in the substrate needs to be not more than $1\times10^4$ (cm$^{-1}$). The data shown in FIG. 11 is as follows.

| Stacking fault density (cm$^{-1}$), | Yield; |
|---|---|
| 500, | 80; |
| 1000, | 75; |
| 4000, | 70; |
| 8000, | 65; |
| 10000, | 20; |
| 50000, | 2 |

Figure 12:
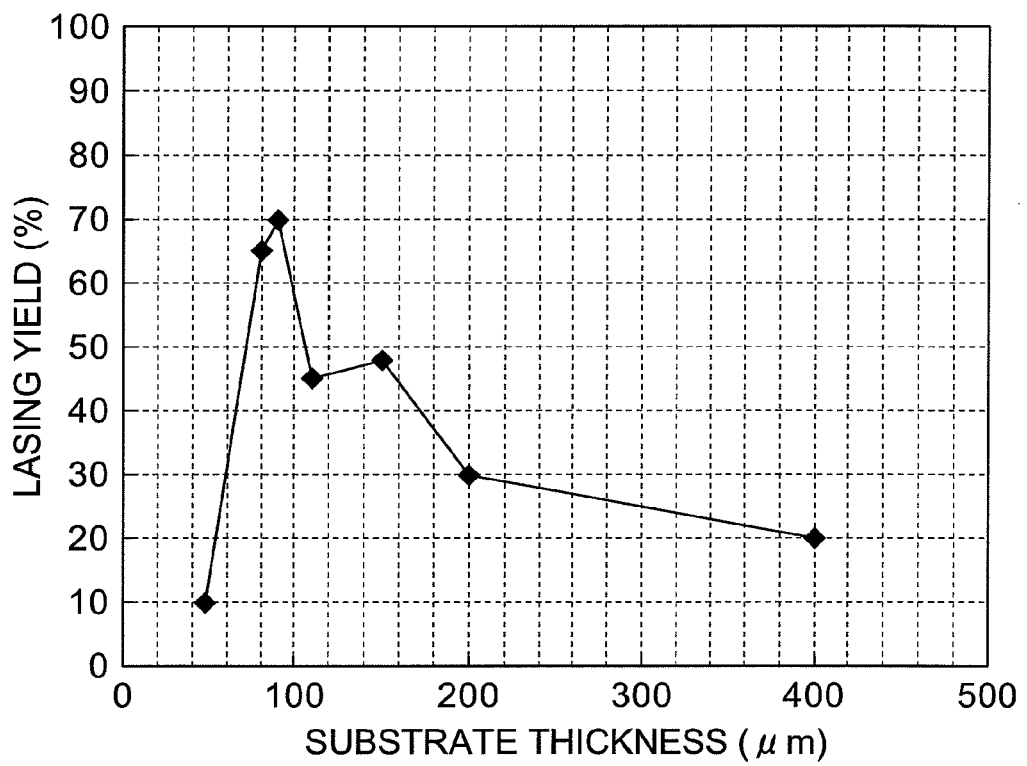
FIG. 12 is a drawing showing a relation of substrate thickness versus lasing yield.

The relation between substrate thickness and lasing yield is investigated, and the result obtained is shown in FIG. 12. The definition of lasing yield is the same as above. FIG. 12 is a plot for laser devices in which the stacking fault density of the substrate is not more than $1\times10^4$ (cm$^{-1}$) and the laser stripe extends along (1) the M-direction. From FIG. 12, the lasing yield is high when the substrate thickness is smaller than 100 μm and larger than 50 μm. When the substrate thickness is larger than 100 μm, the perpendicularity of fractured faces becomes deteriorated. When the thickness is smaller than 50 μm, handling of substrates does not become easy and the semiconductor chips become easy to break. From these, the optimum thickness of the substrate is in a range of not less than 50 μm and not more than 100 μm. The data shown in FIG. 12 is as follows.

| Substrate thickness, | Yield; |
|---|---|
| 48, | 10; |
| 80, | 65; |
| 90, | 70; |
| 110, | 45; |
| 150, | 48; |
| 200, | 30; |
| 400, | 20 |

Example 3

In Example 2, the plurality of epitaxial films for the semiconductor laser are grown on the GaN substrate having the {20-21} surface. As described above, the end faces for the optical cavity are formed through the formation of scribed grooves and by press. In order to find candidates for these end faces, plane orientations different from the a-plane and making an angle near 90° with respect to the (20-21) plane are obtained by calculation. With reference to FIG. 13, the following angles and plane orientations have angles near 90° with respect to the (20-21) plane.

| Specific plane index, | Angle to {20-21} plane; |
|---|---|
| (-1016), | 92.46°; |
| (-1017), | 90.10°; |
| (-1018), | 88.29° |

Figure 14:
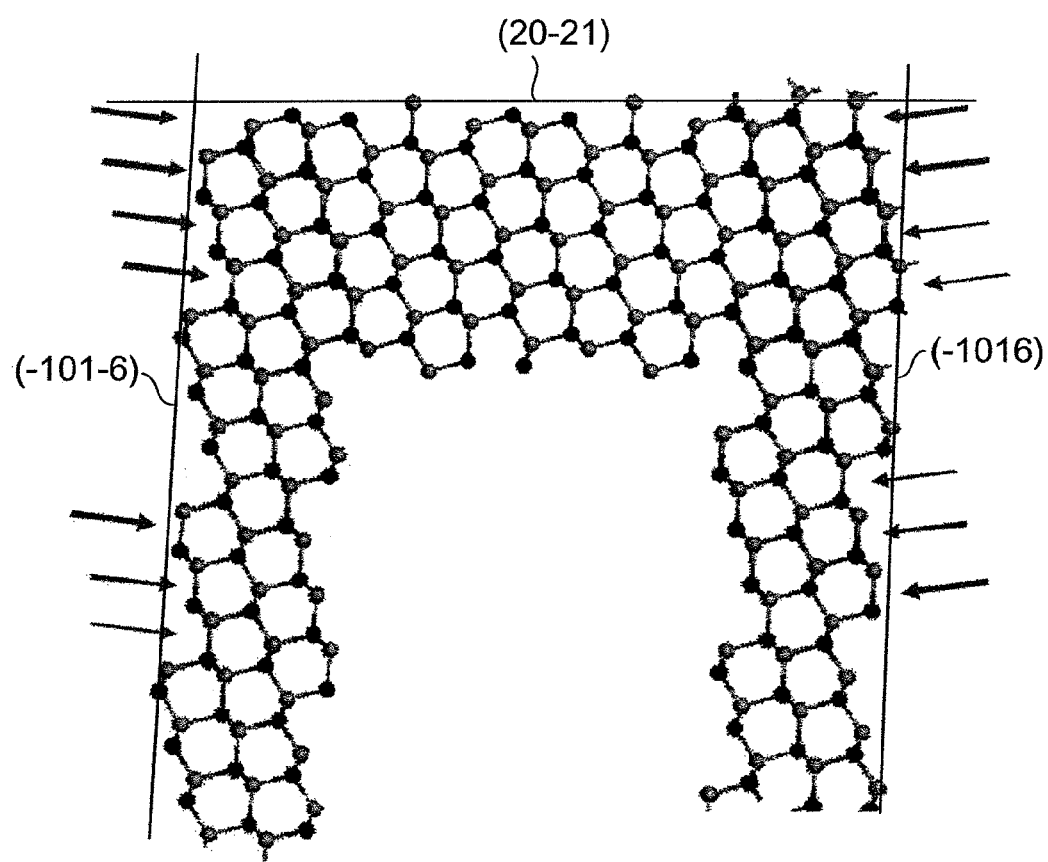
FIG. 14 is a drawing showing atomic arrangements in (20-21) plane, (-101-6) plane, and (-1016) plane.
Figure 15:
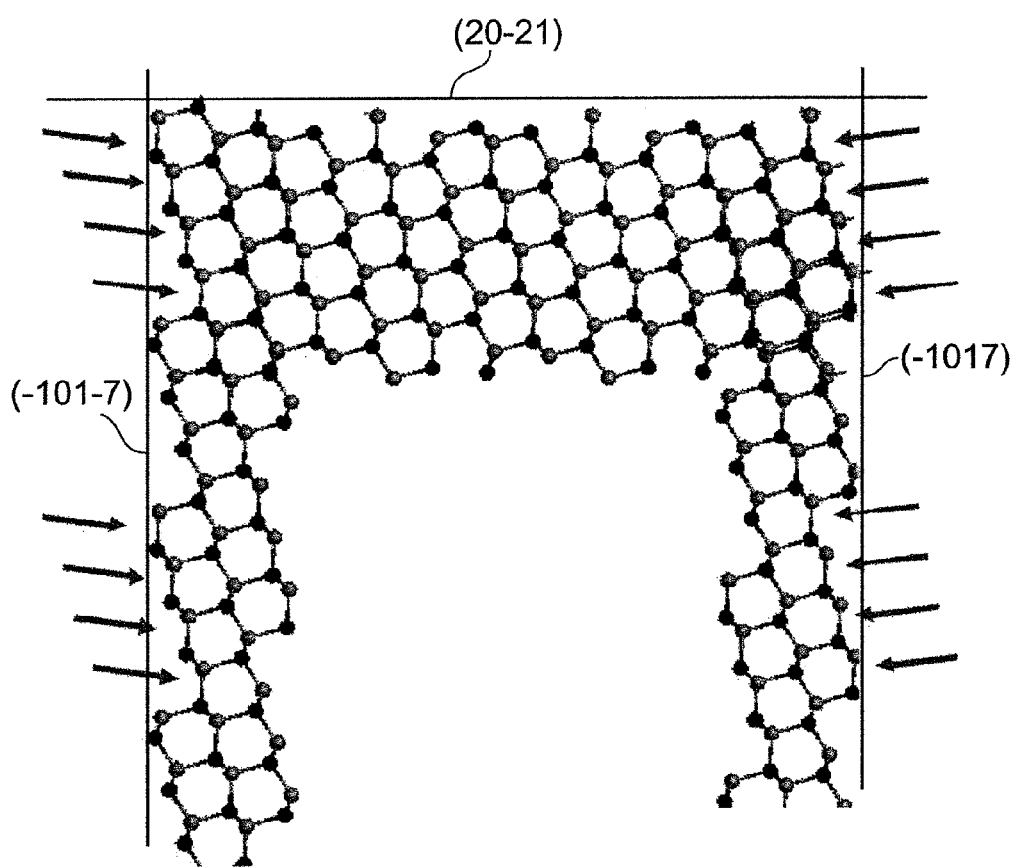
FIG. 15 is a drawing showing atomic arrangements in (20-21) plane, (-101-7) plane, and (-1017) plane.
Figure 16:
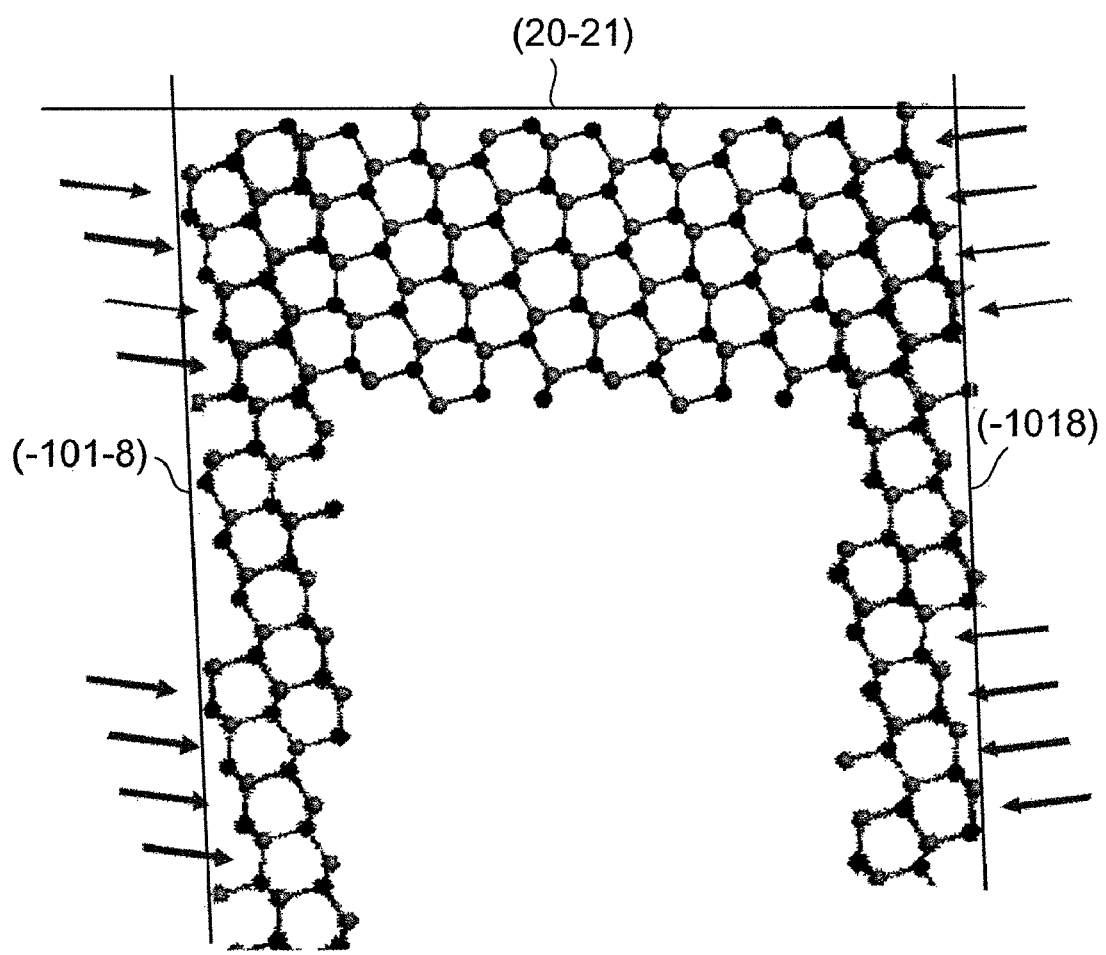
FIG. 16 is a drawing showing atomic arrangements in (20-21) plane, (−101-8) plane, and (−1018) plane.

FIG. 14 is a drawing showing atomic arrangements in the (20-21) plane, (-101-6) plane, and (-1016) plane. FIG. 15 is a drawing showing atomic arrangements in the (20-21) plane, (-101-7) plane, and (-1017) plane. FIG. 16 is a drawing showing atomic arrangements in the (20-21) plane, (-101-8) plane, and (-1018) plane. As shown in FIGS. 14 to 16, local atom arrangements indicated by arrows show configurations of atoms with charge neutrality, and electrically neutral arrangements of atoms appear periodically. The reason why near-vertical faces with respect to the grown surface are obtained can be that creation of fractured faces is considered to be relatively stable because of the periodic appearance of the neutral atomic configurations in terms of charge.

According to various experiments containing the above-described Examples 1 to 3, the angle ALPHA can be in a range of not less than 45° and not more than 80° or in a range of not less than 100° and not more than 135°. In order to improve the laser chip yield, the angle ALPHA can be in a range of not less than 63° and not more than 80° or in a range of not less than 100° and not more than 117°. The typical semipolar principal surface can be any one of {20-21} plane, {10-11} plane, {20-2-1} plane, and {10-1-1} plane. Furthermore, the principal surface can be a slight tilt surface from these semipolar principal surfaces. For example, the semipolar principal surface can be a slight tilt surface off in a range of not less than −4° and not more than +4° toward the m-plane with respect to any one of {20-21} plane, {10-11} plane, {20-2-1} plane, and {10-1-1} plane.

Example 4

In Part (a) of FIG. 21 and Part (b) of FIG. 21, the observation results obtained is shown as follows: scribed grooves are formed in the direction DIR1 perpendicular to the projected direction DIR2 of the c-axis onto the substrate principal surface, on a surface of a substrate product including a (20-21) GaN substrate, breaking with a blade is carried out to obtain a laser bar, and the principal surface side of the laser bar (the surface side where the scribed grooves are formed) is observed with an optical microscope. In Part (a) of FIG. 21, the laser bar LBC1 formed by the conventional breaking method without use of the breaking method according to the embodiment is shown, and in Part (b) of FIG. 21, the laser bar LBC2 (e.g., corresponding to the laser bar LB1) formed by the breaking method according to the embodiment is shown. The breaking is carried out in the orientation of the direction DIR1 shown in the drawing. The direction DIR2 is the projected direction of the c-axis of the hexagonal group-III nitride semiconductor onto the surface where the scribed grooves are formed.

Figure 21:
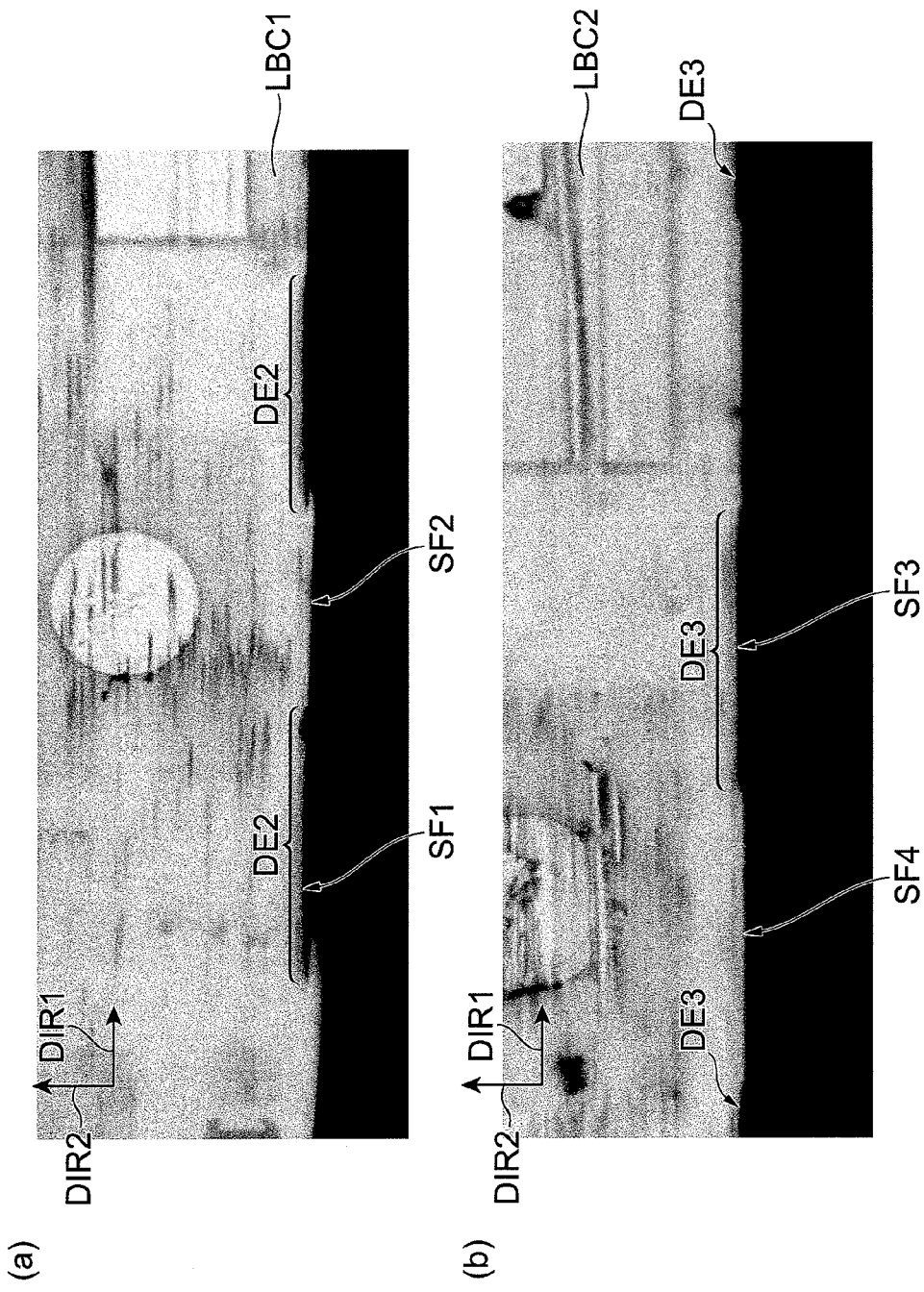
FIG. 21 is a drawing for a comparison between a cross section by the conventional fabrication method and a cross section by the fabrication method according to the present embodiment.
Figure 22:
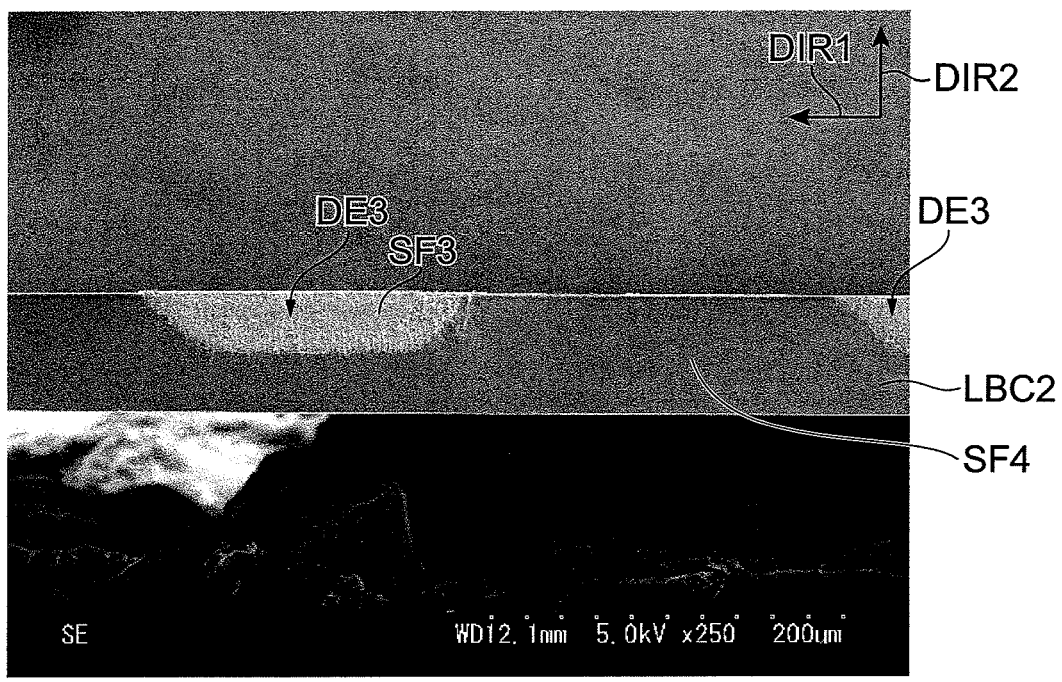
FIG. 22 is a drawing showing an appearance on an end face side of the laser bar produced by the fabrication method according to the present embodiment.

In Part (a) of FIG. 21, it is shown that notches DE2 are formed from the scribed grooves by the breaking, and in Part (b) of FIG. 21, it is shown that notches DE3 are formed from the scribed grooves by the breaking. The notches DE3 correspond to the notches DE1. Referring to Part (a) of FIG. 21, the breaking proceeds in the direction DIR1 from a side wall surface SF1 of the notch DE2 to form an end face SF2, this end face SF2 reaches the end of the adjacent notch DE2, and the end face SF2 formed by this breaking tilts relatively largely relative to the side wall surface SF1. Namely, it is seen that the differently tilting portions are formed in the laser cavity mirror including the side wall surface SF1 and the end face SF2. Since the laser cavity mirrors include the differently tilting portions in the planes parallel to the substrate as described above, the reflectance decreases and the lasing threshold of the laser is highly likely to increase in conjunction therewith. On the other hand, referring to Part (b) of FIG. 21, the breaking proceeds in the direction DIR1 from a side wall surface SF3 of the notch DE3 to form an end face SF4, this end face SF4 reaches an end of the adjacent notch DE3, and the end face SF4 formed by this breaking is approximately parallel to the side wall surface SF3. Namely, the case of Part (b) of FIG. 21 is different from the case of Part (a) of FIG. 21, and thus, there is no differently tilting portion recognized in the laser cavity minor. Namely, when the breaking method of the present embodiment is applied, the formed laser cavity minors have enough flatness and perpendicularity, and thus, it becomes feasible to fabricate the group-III nitride semiconductor laser device with high lasing yield at or below a certain threshold current. FIG. 22 shows the observation result of the laser bar LBC2 shown in Part (b) of FIG. 21, from the end face side with an optical microscope. The direction DIR1 shown in FIG. 22 is opposite to the direction DIR1 shown in FIG. 21.

Example 5

Figure 23:
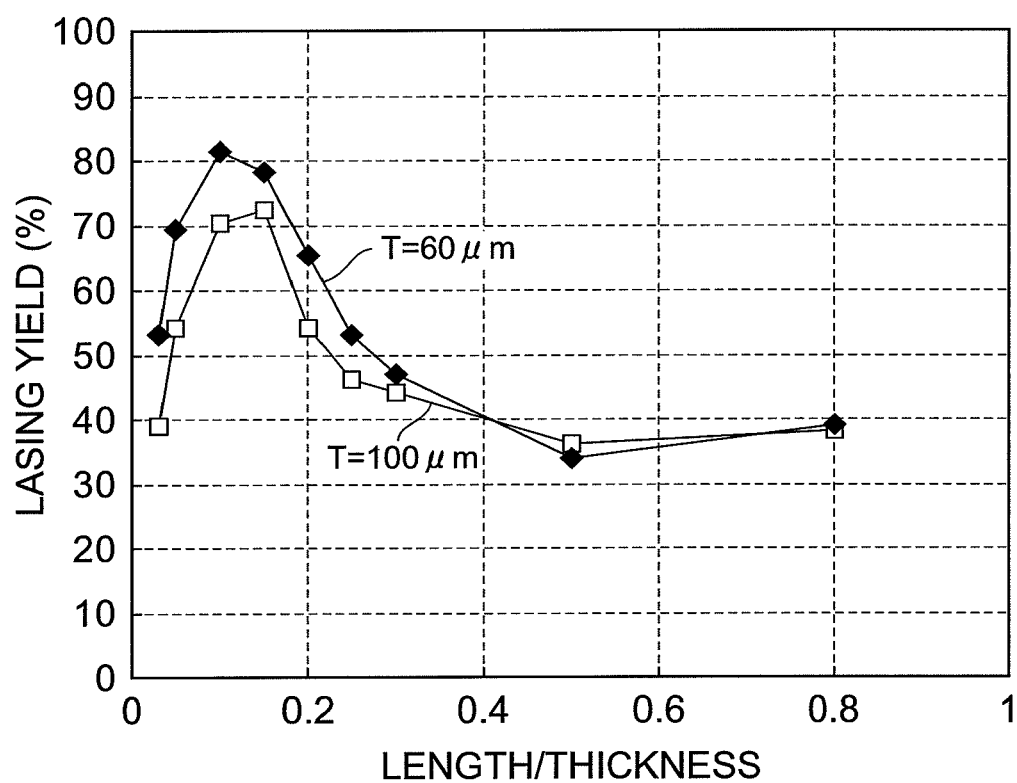
FIG. 23 is a drawing showing a relation of ratio of depth of notch to thickness of laser device, versus lasing yield.

Investigation is conducted to investigate the relation of lasing yield versus ratio (LENGTH/THICKNESS) of LENGTH1 (the same also applies to LENGTH2 and LENGTH3, and thus it will be referred to hereinafter simply as LENGTH) to THICKNESS1 (the same also applies to THICKNESS2, and thus it will be referred to hereinafter simply as THICKNESS), and the result of the investigation is as shown in FIG. 23. THICKNESS is two types; 60 µm and 100 µm. In the present example, the lasing yield is defined as (the number of laser chips at the threshold current of not more than 1000 mA)/(the number of measured chips). The result shown in FIG. 23 is obtained as follows: the substrate used is one with the stacking fault density of not more than $1\times10^4$ (cm$^{-1}$), LE1 and LE2 both are 50 µm (LE1=LE2, and thus, LE1 and LE2 will be referred to hereinafter simply as LE), and the tilt angle BETA1 (tilt angle BETA3) and the tilt angle BETA2 (tilt angle BETA4) both are 30°. It is seen from FIG. 23 that the lasing yield reduces by half when the value of LENGTH/THICKNESS is over 0.4. A conceivable reason for it is that stress concentration at a tip of a scribed groove increases with decrease in the value of LENGTH/THICKNESS, so as to make it easier to obtain a flat fractured face. It is also seen that the lasing yield quickly decreases with the value of LENGTH/THICKNESS becoming smaller than 0.05. This is because the scribed groove is too shallow to play a role of guiding fracture. It is seen from the above result that the value of LENGTH/THICKNESS is preferably in a range of not less than 0.05 and not more than 0.4. The data shown in FIG. 23 is as described below (in the data herein, particularly, LENGTH/THICKNESS is denoted by "R" and THICKNESS by "T").

| R, | lasing yield with T = 60 µm, | lasing yield with T = 100 µm; |
|---|---|---|
| 0.03, | 53, | 39; |
| 0.05, | 69, | 54; |
| 0.1, | 81, | 70; |
| 0.15, | 78, | 72; |
| 0.2, | 65, | 54; |
| 0.25, | 53, | 46; |
| 0.3, | 47, | 44; |
| 0.5, | 34, | 36; |
| 0.8, | 39, | 38 |

Example 6

Figure 24:
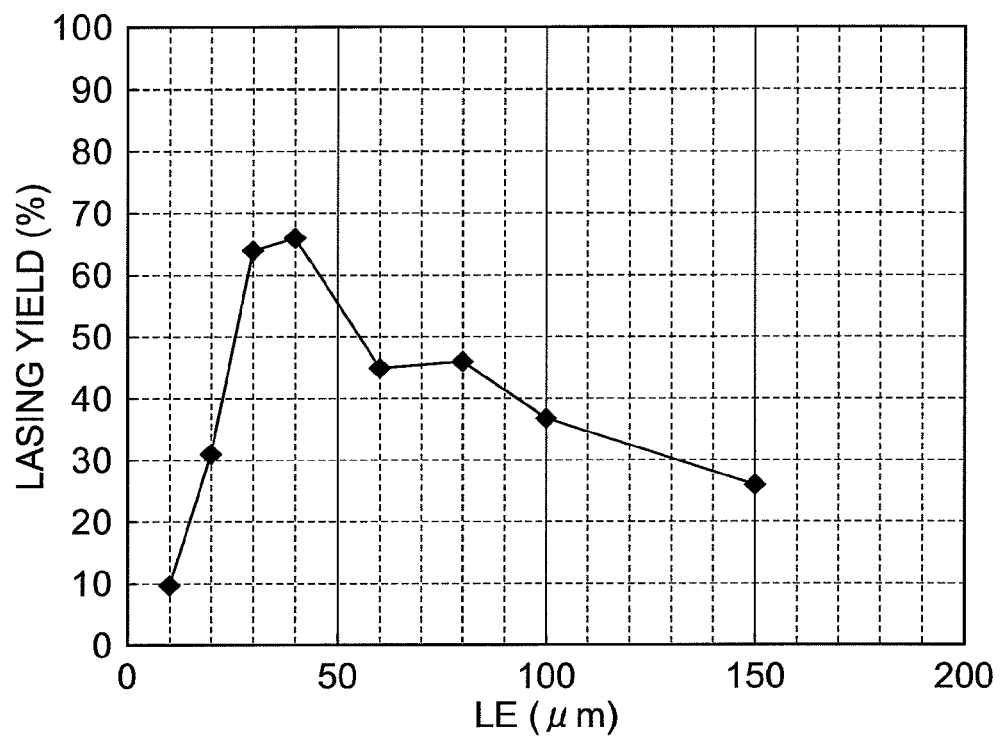
FIG. 24 is a drawing showing a relation of position of notch end versus lasing yield.

Investigation is conducted to investigate the relation of lasing yield versus LE, and the result obtained is as shown in FIG. 24. The result shown in FIG. 24 is obtained as follows: the substrate used is one with the stacking fault density of not more than $1\times10^4$ (cm$^{-1}$), THICKNESS is 80 µm, LENGTH is 20 µm, and the tilt angle BETA1 (tilt angle BETA3) and the tilt angle BETA2 (tilt angle BETA4) both are 30°. The definition of lasing yield is the same as above. It is seen from FIG. 24 that the lasing yield quickly decreases when LE becomes smaller than 30 μm. This is because the waveguide is too close to the scribed grooves, and thus, the active layer under the waveguide is damaged by laser irradiation. It is also seen that the lasing yield reduces by half when LE is over 100 μm. This is because a longer scribed groove can guide the fracture easier. It is seen from the above that LE is preferably in a range of not less than 30 μm and not more than 100 μm. The data shown in FIG. 24 is as described below.

| LE, | lasing yield; |
|---|---|
| 10, | 10; |
| 20, | 31; |
| 30, | 64; |
| 40, | 66; |
| 60, | 45; |
| 80, | 46; |
| 100, | 37; |
| 150, | 26 |

Example 7

Figure 25:
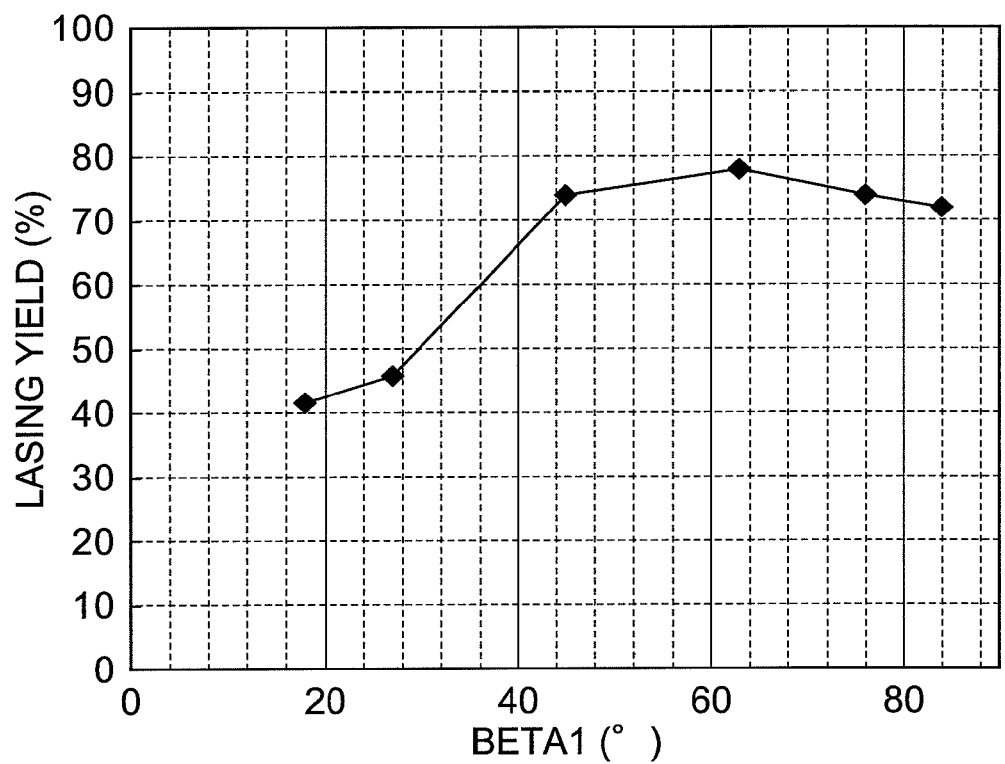
FIG. 25 is a drawing showing a relation of tilt angle of one end of notch versus lasing yield.
Figure 26:
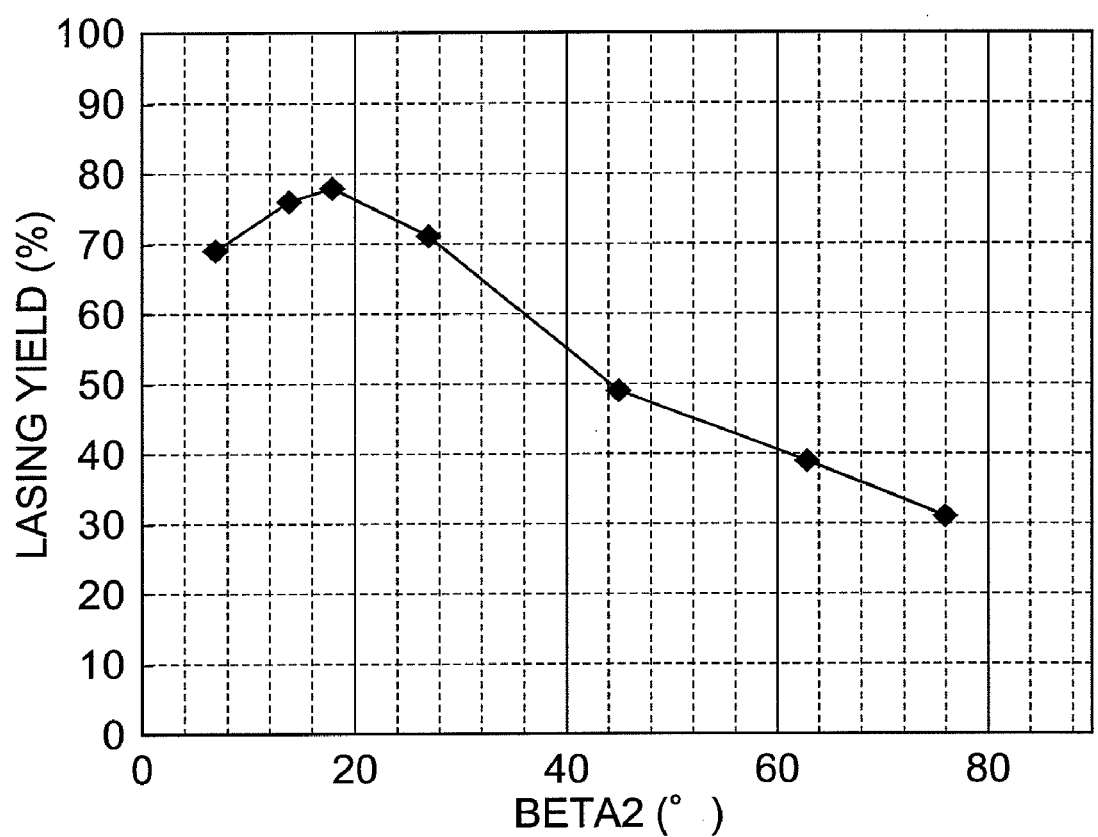
FIG. 26 is a drawing showing a relation of tilt angle of another end of notch versus lasing yield.

Investigation is conducted to investigate the relation of lasing yield versus tilt angle BETA1, and the result obtained is as shown in FIG. 25. The result shown in FIG. 25 is obtained as follows: the substrate used is one with the stacking fault density of not more than $1\times10^4$ (cm$^{-1}$), THICKNESS is 80 μm, LENGTH is 20 μm, LE is 50 μm, and the tilt angle BETA2 is 30°. The definition of lasing yield is the same as above. It is seen from FIG. 25 that the lasing yield is high when the tilt angle BETA1 is in a range of not less than 45° and not more than 85°. Another investigation is conducted to investigate the relation of lasing yield versus tilt angle BETA2, and the result obtained is as shown in FIG. 26. The result shown in FIG. 26 is obtained as follows: the substrate used is one with the stacking fault density of not more than $1\times10^4$ (cm$^{-1}$), THICKNESS is 80 μm, LENGTH is 20 μm, LE is 50 μm, and the tilt angle BETA3 is 45°. The definition of lasing yield is the same as above. It is seen from FIG. 26 that the lasing yield is high when the tilt angle BETA2 is in a range of not less than 10° and not more than 30°. A conceivable reason for it is that when the tilt angle BETA2 is smaller than the tilt angle BETA1, stress concentration increases on the downstream side of fracture, to facilitate development of a fractured line in parallel with the scribed groove. It is seen from the above that the tilt angle BETA1 (tilt angle BETA3) is preferably in a range of not less than 45° and not more than 85°, and that the tilt angle BETA2 (tilt angle BETA4) is preferably in a range of not less than 10° and not more than 30°. The data shown in FIG. 25 is as described below.

| BETA1, | lasing yield; |
|---|---|
| 18, | 42; |
| 27, | 46; |
| 45, | 74; |
| 63, | 78; |
| 76, | 74; |
| 84, | 72 |

The data shown in FIG. 26 is as described below.

| BETA2, | lasing yield; |
|---|---|
| 7, | 69; |
| 14, | 76; |
| 18, | 78; |
| 27, | 71; |
| 45, | 49; |
| 63, | 39; |
| 76, | 31 |

By forming the dashed-line scribed grooves with the controlled shape, as described above, it becomes feasible to improve the quality of the laser cavity mirrors using the fractured faces and to fabricate semipolar LDs with high lasing yield at the threshold current below a certain level.

The above embodiments provide the group-III nitride semiconductor laser device with the laser cavity enabling the low threshold current, on the semipolar principal surface of the hexagonal group-III nitride, and the method for stably fabricating the group-III nitride semiconductor laser device.

The principle of the present invention was illustrated and described in the preferred embodiments, but it should be noted that it is recognized by those skilled in the art that the present invention can be modified in arrangement and detail without departing from the principle. The present invention is by no means limited to the specific configurations disclosed in the embodiments. Therefore, the applicants claim all modifications and changes falling within the scope of claims and coming from the scope of spirit thereof.

What is claimed is:

1. A method of fabricating a group-III nitride semiconductor laser device, the method comprising the steps of:
   preparing a substrate of a hexagonal group-III nitride semiconductor, the substrate having a semipolar principal surface;
   forming a substrate product having a laser structure, an anode electrode and a cathode electrode, the laser structure including the substrate and a semiconductor region, the semiconductor region being formed on the semipolar principal surface;
   scribing a first surface of the substrate product in part in a direction of an a-axis of the hexagonal group-III nitride semiconductor, thereby to make a plurality of scribed grooves in the first surface;
   carrying out breakup of the substrate product by pressing against a second surface of the substrate product, to form another substrate product and a laser bar; and
   processing end faces of the laser bar, and thereafter cutting the processed laser bar along cut planes which extend in a direction intersecting with the a-axis of the hexagonal group-III nitride semiconductor and which pass through the respective scribed grooves, to break the processed laser bar into a plurality of the group-III nitride semiconductor laser devices,
   the first surface being opposite to the second surface,
   the semiconductor region being located between the first surface and the substrate,
   the laser bar having first and second end faces, the first and second end faces being formed by the breakup, the first and second end faces extending from the first surface to the second surface,
   the first and second end faces constituting a laser cavity of the group-III nitride semiconductor laser device,
   the anode electrode and the cathode electrode being formed on the laser structure,
   the semiconductor region including a first cladding layer of a first conductivity type gallium nitride-based semiconductor, a second cladding layer of a second conductivity type gallium nitride-based semiconductor and an active layer, the active layer being provided between the first cladding layer and the second cladding layer, the first cladding layer, the second cladding layer, and the active layer being arranged along a normal axis to the semipolar principal surface, the active layer including a gallium nitride-based semiconductor layer, a c-axis of the hexagonal group-III nitride semiconductor of the substrate tilting at a finite angle ALPHA with respect to the normal axis toward an m-axis of the hexagonal group-III nitride semiconductor, the first and second end faces intersecting with an m-n plane which is defined by the m-axis of the hexagonal group-III nitride semiconductor and the normal axis, the scribing being carried out using a laser scriber, a plurality of scribed grooves being formed in the first surface by the scribing, a first portion being included in a side wall surface of the scribed groove and connecting with the first surface at one end of the scribed groove, the first portion tilting at a gradient of a first tilt angle in a range of not less than 45° and not more than 85° with respect to the first surface, a second portion being included in the side wall surface and connecting with the first surface at the other end of the scribed groove, the second portion tilting at a gradient of a second tilt angle in a range of not less than 10° and not more than 30° with respect to the first surface, a direction from the one end toward the other end of the scribed groove being a direction intersecting with a projected direction of the c-axis of the hexagonal group-III nitride semiconductor onto the semipolar principal surface, the breaking for the laser bar proceeded in the direction from the one end toward the other end of the scribed groove in the step of forming the other substrate product and the laser bar, a quotient being obtained by dividing a distance from a bottom wall surface of the scribed groove to a virtual plane which extends along the first surface from the first surface above the bottom wall surface, by a distance from the first surface to the second surface, the quotient being in a range of not less than 0.05 and not more than 0.4, and a distance from the one end or the other end of the scribed groove lying between the two cut planes adjoining in parallel, to a center plane between the two cut planes, being in a range of not less than 30 μm and not more than 100 μm.

2. The method according to claim 1, wherein the angle ALPHA is in a range of not less than 45° and not more than 80° or in a range of not less than 100° and not more than 135°.

3. The method according to claim 1, wherein the angle ALPHA is in a range of not less than 63° and not more than 80° or in a range of not less than 100° and not more than 117°.

4. The method according to claim 1, wherein the step of forming the substrate product includes performing processing such as slicing or grinding of the substrate so that a thickness of the substrate becomes not more than 400 μm, and wherein the second surface is one of the following: a processed surface formed by the processing; and a surface including an electrode formed on the processed surface.

5. The method according to claim 1, wherein the step of forming the substrate product includes polishing the substrate so that a thickness of the substrate becomes not less than 50 μm and not more than 100 μm, and wherein the second surface is one of the following: a polished surface formed by the polishing; and a surface including an electrode formed on the polished surface.

6. The method according to claim 1, wherein the semipolar principal surface is any one of {20-21} plane, {10-11} plane, {20-2-1} plane, and {10-1-1} plane.

7. The method according to claim 1, wherein the substrate comprises any one of GaN, AlGaN, AlN, InGaN, and InAlGaN.

* * * * *